(12) United States Patent
Okada

(10) Patent No.: US 11,322,335 B2
(45) Date of Patent: May 3, 2022

(54) CHARGED PARTICLE MULTI-BEAM DEVICE

(71) Applicant: EBARA CORPORATION, Tokyo (JP)

(72) Inventor: Shinichi Okada, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 13 days.

(21) Appl. No.: 16/801,555

(22) Filed: Feb. 26, 2020

(65) Prior Publication Data

US 2020/0279718 A1 Sep. 3, 2020

(30) Foreign Application Priority Data

Mar. 1, 2019 (JP) .............................. JP2019-037464

(51) Int. Cl.
| | | |
|---|---|---|
| *H01J 37/317* | (2006.01) | |
| *H01J 37/10* | (2006.01) | |
| *H01J 37/063* | (2006.01) | |
| *H01J 37/32* | (2006.01) | |
| *H01J 37/30* | (2006.01) | |

(52) U.S. Cl.
CPC ........ *H01J 37/3177* (2013.01); *H01J 37/063* (2013.01); *H01J 37/10* (2013.01); *H01J 37/3007* (2013.01); *H01J 37/3255* (2013.01)

(58) Field of Classification Search
None
See application file for complete search history.

(56) References Cited

U.S. PATENT DOCUMENTS

2015/0008331 A1 1/2015 Kemen et al.
2020/0126751 A1* 4/2020 Kemen .................. H01J 37/21

FOREIGN PATENT DOCUMENTS

JP 2009-507351 A 2/2009

* cited by examiner

*Primary Examiner* — James Choi
(74) *Attorney, Agent, or Firm* — Pearne & Gordon LLP

(57) ABSTRACT

A charged particle multi-beam device includes a charged particle source, a collimator lens, a multi-light-source forming unit, and a reduction projection optical system. The multi-light-source forming unit has first to third porous electrodes disposed side by side in an optical axis direction. A plurality of holes for causing the multi-beams to pass is formed in each of the first to third porous electrodes. The first porous electrode and the third porous electrode have the same potential and the second porous electrode has potential different from the potential of the first porous electrode and the third porous electrode. A diameter of the holes on the second porous electrode is formed larger further away from an optical axis such that a surface on which the multi-light sources are located is formed in a shape convex to the charged particle source side.

2 Claims, 26 Drawing Sheets

CALCULATION RESULT

| | ro mm | ri mm | $\Delta$ zo mm | $\Delta z_{FC}$ mm | $\Phi$ mm |
|---|---|---|---|---|---|
| center | 0 | 0 | 0 | 0 | 0.05 |
| 1st | 0.1 | 0.01 | 0.005 | 0.00005 | 0.05055652 |
| 2nd | 0.2 | 0.02 | 0.02 | 0.0002 | 0.05220365 |
| 3rd | 0.3 | 0.03 | 0.045 | 0.00045 | 0.05487569 |
| 4th | 0.4 | 0.04 | 0.08 | 0.0008 | 0.05847711 |

CHARGED PARTICLE MULTI-BEAM DEVICE

CROSS-REFERENCE TO RELATED APPLICATIONS

This application claims the benefit of Japanese Priority Patent Application JP 2019-037464 filed on Mar. 1, 2019, the entire contents of which are incorporated herein by reference.

FIELD

The present technique relates to a charged particle multi-beam device.

BACKGROUND AND SUMMARY

A semiconductor inspection device in the past is a device and a technique adapted to a 100 nm design rule. However, inspection target samples are diversified, including wafers, masks for exposure, EUV masks, NIL (nano-imprint lithography) masks, and substrates. Currently, there are demands for a device and a technique adapted to a 5 to 30 nm design rule for samples. In other words, there are demands for a device and a technique adapted to a generation in which a node in L/S (line/space) or hp (half pitch) in a pattern is 5 to 30 nm. When such samples are inspected with an inspection device, high resolution needs to be obtained.

The samples are masks for exposure, EUV masks, masks (and templates) for nano-imprint, semiconductor wafers, substrates for optical element, substrates for optical circuit, and the like. Among these samples, some samples have patterns and other samples do not have patterns. Some samples having patterns have unevenness and other samples having patterns do not have unevenness. The patterns not having unevenness are formed by different materials. Some samples not having patterns are coated with oxide films and other samples not having patterns are not coated with oxide films.

There has already been proposed an electron beam inspection device by a mapping projection scheme that captures secondary charged particles, which change according to surface characteristics of a sample, forms image data, and inspects, based on the image data, patterns and the like formed on the surface of the sample with a high throughput.

As such an electron beam inspection device, there are an electron beam inspection device that irradiates one electron beam onto a sample and an electron beam inspection device that irradiates a plurality of electron beams onto a sample. In the latter case, an electron beam generation device needs to generate a plurality of electron beams. JP 2009-507351 W discloses a configuration in which an aperture having a plurality of openings formed therein is provided and one electron beam is caused to pass through the plurality of openings to be separated into a plurality of electron beams. Each of the separated plurality of electron beams passes through a group of porous electrodes to be condensed on one surface and multi-light sources are formed. The multi-light sources are reduced and projected on a sample surface by a reduction optical system.

Incidentally, in an ideal optical system, as illustrated in FIG. 23, an image surface of a plane object surface (multi-light sources) is a plane. However, in an actual optical system, as illustrated in FIG. 24, an image surface of a plane object surface (multi-light sources) is a curved surface concave to a lens side because of the influence of a field curvature. That is, a focal position of a beam further deviates to the lens side further away from an optical axis. Therefore, a blur of an image on a sample surface is larger further away from the optical axis.

In order to correct the field curvature, JP 2009-507351 W proposes to form, as curved surfaces, the surfaces of porous electrodes opposed to each other and increase inter-electrode distances of holes further away from the optical axis to curve the shape of the object surface (the multi-light sources) in a direction convex to an upstream side. However, in such a configuration, since the surfaces of the porous electrodes are the curved surfaces, it is likely that an electric field between the porous electrodes are complicated and the beam bends. Further, it is difficult to manufacture the porous electrodes themselves.

It is desired to provide a charged particle multi-beam device that can correct a field curvature.

A charged particle multi-beam device according to an embodiment includes:

a charged particle source that emits a charged particle beam;

a collimator lens that collimates the charged particle beam emitted from the charged particle source;

a multi-light-source forming unit that divides the collimated charged particle beam into a plurality of beams to form multi-beams and condenses each of the multi-beams on one surface to form multi-light sources; and a reduction projection optical system that reduces and projects the multi-light sources on a sample surface, wherein the multi-light-source forming unit has first to third porous electrodes disposed side by side in an optical axis direction in order from the charged particle source side, a plurality of holes for causing the multi-beams to pass is formed in each of the first to third porous electrodes, the first porous electrode and the third porous electrode have identical potential and the second porous electrode has potential different from the potential of the first porous electrode and the third porous electrode, and a diameter of the holes on the second porous electrode is formed larger further away from an optical axis such that a surface on which the multi-light sources are located is formed in a shape convex to the charged particle source side.

BRIEF DESCRIPTION OF DRAWINGS

FIG. 19 is a table illustrating a calculation result of the inner diameter of the holes of the second porous electrode;

DETAILED DESCRIPTION OF NON-LIMITING EXAMPLE EMBODIMENTS

Figure 1:
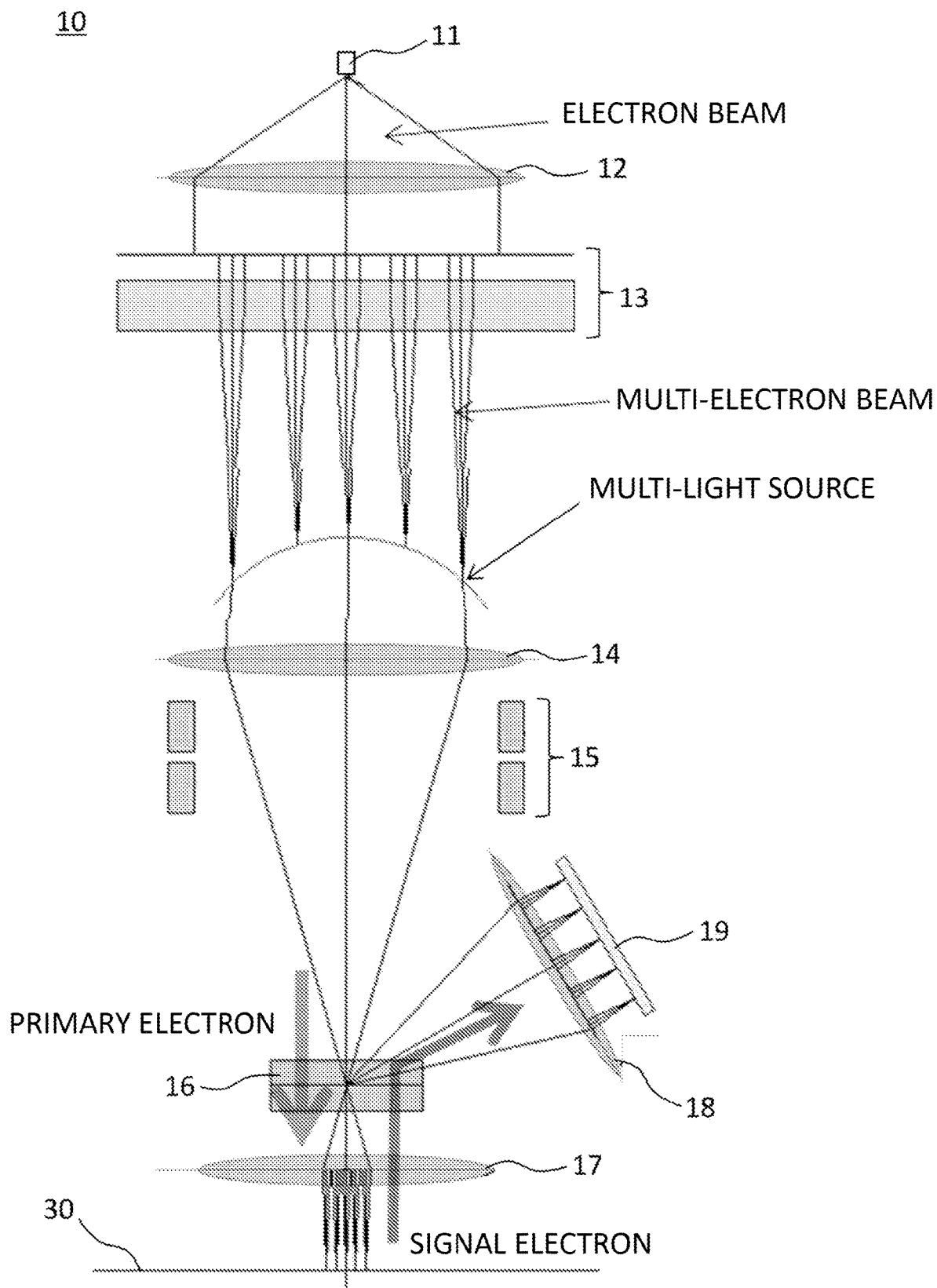
FIG. 1 is a diagram illustrating a schematic configuration of a charged particle multi-beam device according to an embodiment.

A charged particle multi-beam device according to a first aspect of an embodiment includes:

a charged particle source that emits a charged particle beam;

a collimator lens that collimates the charged particle beam emitted from the charged particle source;

a multi-light-source forming unit that divides the collimated charged particle beam into a plurality of beams to form multi-beams and condenses each of the multi-beams on one surface to form multi-light sources; and a reduction projection optical system that reduces and projects the multi-light sources on a sample surface, wherein the multi-light-source forming unit has first to third porous electrodes disposed side by side in an optical axis direction in order from the charged particle source side, a plurality of holes for causing the multi-beams to pass is formed in each of the first to third porous electrodes, the first porous electrode and the third porous electrode have identical potential and the second porous electrode has potential different from the potential of the first porous electrode and the third porous electrode, and a diameter of the holes on the second porous electrode is formed larger further away from an optical axis such that a surface on which the multi-light sources are located is formed in a shape convex to the charged particle source side.

According to such an aspect, the diameter of the holes on the second porous electrode is formed larger further away from the optical axis. The surface (an object surface) on which the multi-light sources are located is formed in the shape convex to the charged particle source side. Therefore, the position of the light source is closer to the reduction optical system (lens) side further away from the optical axis. Consequently, the position of the image surface further shifts to the opposite side of the lens further away from the optical axis. Therefore, the influence of the field curvature that causes the focal position to further shift to the lens side further away from the optical axis can be offset and corrected. Consequently, even in a position away from the optical axis, a blur of an image on the sample surface can be reduced. Since the first porous electrode and the third porous electrode have the same potential, the number of power supplies may be small.

A charged particle multi-beam device according to a second aspect of the embodiment is the charged particle multi-beam device according to the first aspect, wherein portions where the plurality of holes is formed in the first to third porous electrodes respectively have flat shapes.

According to such an aspect, it is easy to manufacture the porous electrodes themselves compared with when the portions where the plurality of holes is formed in the first to third porous electrodes are formed in curved surface shapes.

A charged particle multi-beam device according to a third aspect of the embodiment is the charged particle multi-beam device according to the first or second aspect, wherein the first porous electrode and the third porous electrode are assembled in a socket-and-spigot structure.

According to such an aspect, it is easily align the first porous electrode and the third porous electrode.

A charged particle multi-beam device according to a fourth aspect of the embodiment is the charged particle multi-beam device according to any one of the first to third aspects, wherein in the multi-light-source forming unit, a porous aperture that divides the collimated charged particle beam into a plurality of beams to form multi-beams is provided further on the charged particle source side than the first porous electrode.

A charged particle multi-beam device according to a fifth aspect of the embodiment is the charged particle multi-beam device according to any one of the first to third aspects, wherein in the multi-light-source forming unit, the first porous electrode divides the collimated charged particle beam into a plurality of beams to form multi-beams.

According to such an aspect, since the porous aperture can be omitted, structure is simple.

A charged particle multi-beam device according to a sixth aspect of the embodiment is the charged particle multi-beam device according to any one of the first to fifth aspects, wherein the second porous electrode is divided into a plurality of regions according to distances from the optical axis, and each of the regions includes at least two holes having different distances from the optical axis, and diameters of the holes are set identical for each of the regions, and the diameters of the holes are larger in the regions further away from the optical axis.

According to such an aspect, since the diameters of the holes are set identical for each of the regions, structure is simple.

A method according to a seventh aspect of the embodiment is a method of determining the diameter of the holes of the second porous electrode in the charged particle multi-beam device according to any one of the first to sixth aspects, the method including:

calculating a field curvature coefficient A of the reduction projection optical system with a simulation or an experiment;

calculating, with a simulation, a relation between an inner diameter $\Phi$ of the holes of the second porous electrode and a shift amount $\Delta z_o$ of a focal position and approximating the relation with following Eq. 1A:

$$\Delta z_o = a\Phi^2 + b\Phi + c \quad \text{(Eq.1A)}$$

to thereby determine coefficients a, b, and c of an approximation function; and determining, using on-axis potential $\Phi_o$ on an object surface in the reduction projection optical system and on-axis potential $\Phi_i$ on an image surface, a diameter $\Phi$ of the holes of the second porous electrode at a distance $r_o$ from the optical axis to satisfy following Eq. 2A:

$$Ar_o^2 \sqrt{\frac{\Phi_o}{\Phi_i}} = a\Phi^2 + b\Phi + c. \quad \text{(Eq.2A)}$$

A method according to an eighth aspect of the embodiment is a method of determining the diameter of the holes of the second porous electrode in the charged particle multi-beam device according to any one of the first to sixth aspects, the method including:

calculating a field curvature coefficient A of the reduction projection optical system with a simulation or an experiment;

calculating, with a simulation, a relation between an inner diameter $\Phi$ of the holes of the second porous electrode and a shift amount $\Delta z_o$ of a focal position and approximating the relation with following Eq. 3A $$\Delta z_o = a_n \Phi^n + a_{n-1} \Phi^{n-1} \ldots + a_1 \Phi + a \quad \text{(Eq.3A)}$$

to thereby calculate coefficients $a_n$, $a_{n-1}$ ... $a_1$, and a (n is a natural number equal to or larger than 3) of an approximation function; and determining, using on-axis potential $\Phi_o$ on an object surface in the reduction projection optical system and on-axis potential $\Phi_i$ on an image surface, a diameter $\Phi$ of the holes of the second porous electrode at a distance $r_o$ from the optical axis to satisfy following Eq. 4A:

$$Ar_o^2 \sqrt{\frac{\Phi_o}{\Phi_i}} = a_n \Phi^n + a_{n-1} \Phi^{n-1} \ldots + a_1 \Phi + a. \quad \text{(Eq.4A)}$$

Specific examples of an embodiment are explained in detail below with reference to the accompanying drawings. Note that, in the following explanation and the drawings referred to in the following explanation, the same reference numerals and signs are used for portions that can be configured the same, and redundant explanation of the portions is omitted.

<Configuration of a Charged Particle Multi-Beam Device>

FIG. 1 is a diagram illustrating a schematic configuration of a charged particle multi-beam device 10 according to an embodiment. Note that, in the following explanation, an electron multi-beam device is explained as an example of the charged particle multi-beam device 10. However, the electron multi-beam device is only an example. The charged particle multi-beam device according to this embodiment is not limited to the electron multi-beam device and may be, for example, an ion multi-beam device. A sample 30, which is a processing target of the charged particle multi-beam device 10, may be a silicon wafer, a glass mask, a semiconductor substrate, a semiconductor pattern substrate, a substrate having a metal film, or the like.

As illustrated in FIG. 1, the charged particle multi-beam device 10 has a not-illustrated stage that holds the sample 30, a primary optical system 10a that irradiates a charged particle multibeam on the sample 30 on the stage, and a secondary optical system 10b that forms, on a detector 119, an enlarged image of a signal electron (a secondary electron, a reflection electron, or the like) emitted from the sample 30.

The primary optical system 10a is configured to generate a charged particle multibeam and irradiates the charged particle multibeam toward the sample 30 on the stage. In an example illustrated in FIG. 1, the primary optical system 10a has a charged particle source 11, a collimator lens 12, a multi-light-source forming unit 13, a reduction projection optical system including a transfer lens 14 and an objective lens 17, a scan deflector 15, and a beam separator 16.

The charged particle source 11 is provided at one end of a not-illustrated column (vacuum tube). The charged particle source 11 emits a charged particle beam (for example, an electron beam) into the column. As the charged particle source 11, for example, a photoelectron source having a laser light source and a photoelectric surface described in JP 2012-253007 A can be used. A photoelectric surface structure used in the photoelectron source can achieve high efficiency. Note that the charged particle source 11 is not limited to the photoelectron source if the charged particle source 11 can emit a charged particle beam (for example, an electron beam). For example, an electron gun such as $LaB_6$ can also be used as the charged particle source 11.

The collimator lens 12 is disposed near the charged particle source 11. The collimator lens 12 collimates the charged particle beam emitted from the charged particle source 11 and guides the charged particle beam to the multi-light-source forming unit 13.

Figure 2:
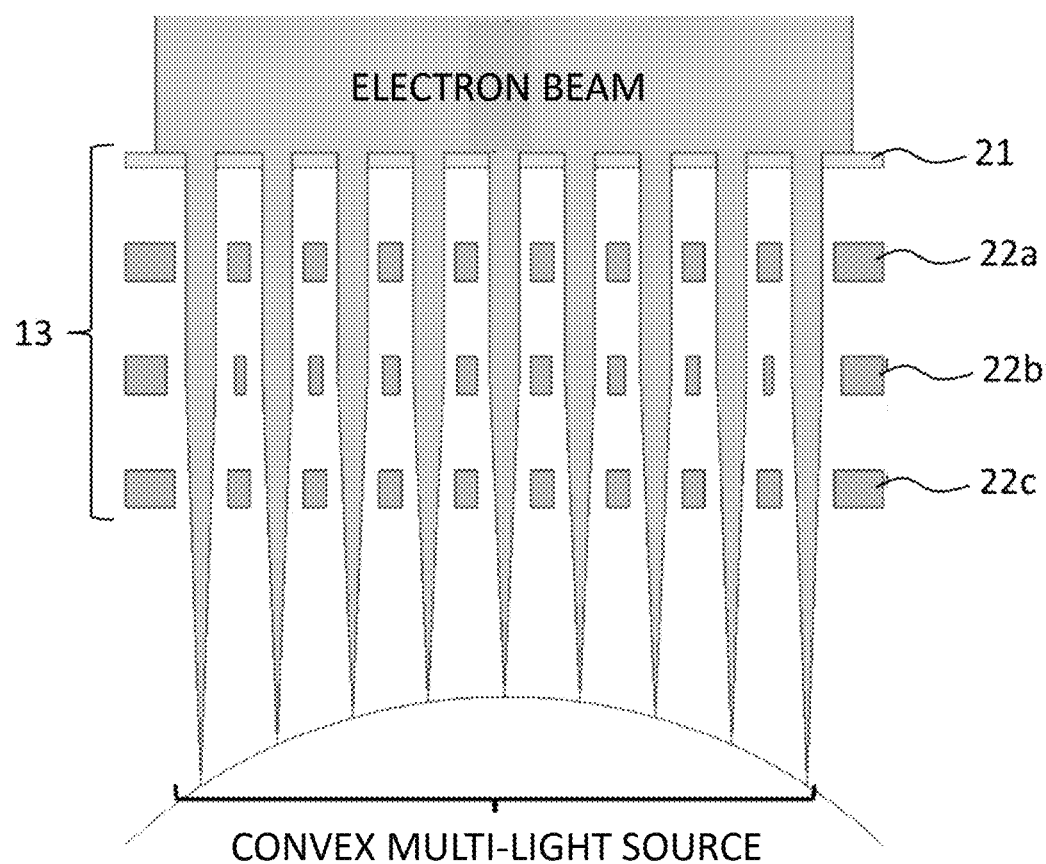
FIG. 2 is a schematic diagram illustrating an example of a configuration of a multi-light-source forming unit.

The multi-light-source forming unit 13 is disposed further on a beam downstream side than the collimator lens 12. A plurality of holes for causing multi-beams to pass is formed in the multi-light-source forming unit 13. FIG. 2 is a plan view illustrating an example of arrangement of the holes in the multi-light-source forming unit 13. The charged particle beam collimated by the collimator lens 12 passes through the plurality of holes formed in the multi-light-source forming unit 13 to be separated into a plurality of beams and multi-beams are formed. Each of the separated multi-beams is condensed (focused) on imaginary one surface and multi-light sources are formed.

Figure 3:
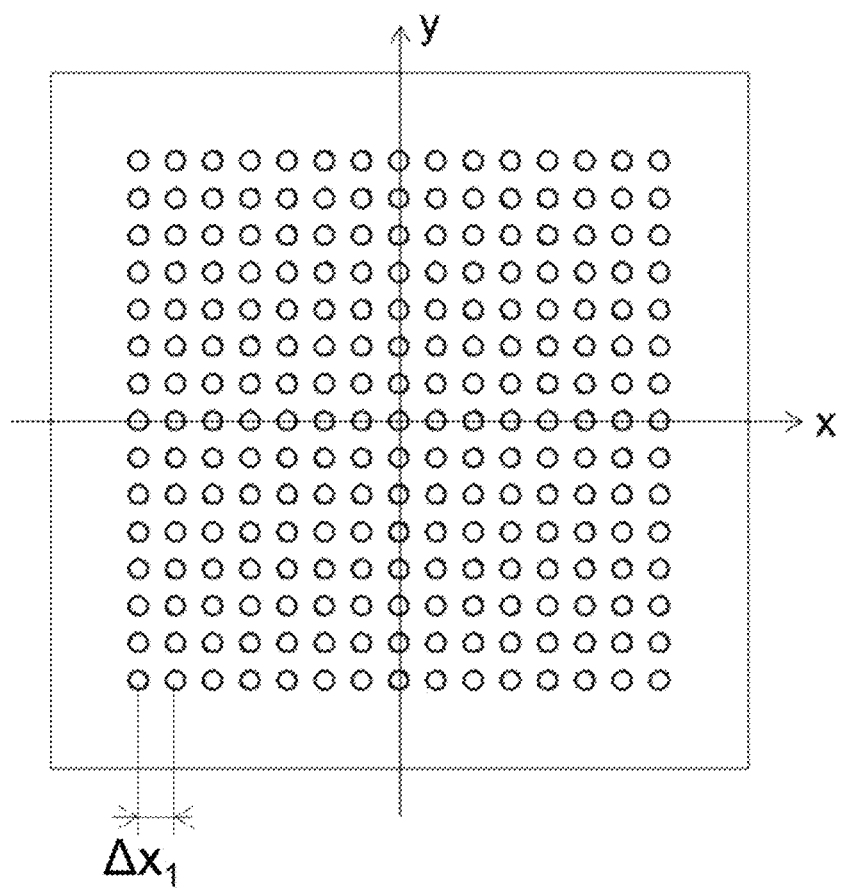
FIG. 3 is a plan view illustrating an example of arrangement of holes in the multi-light-source forming unit.
Figure 4:
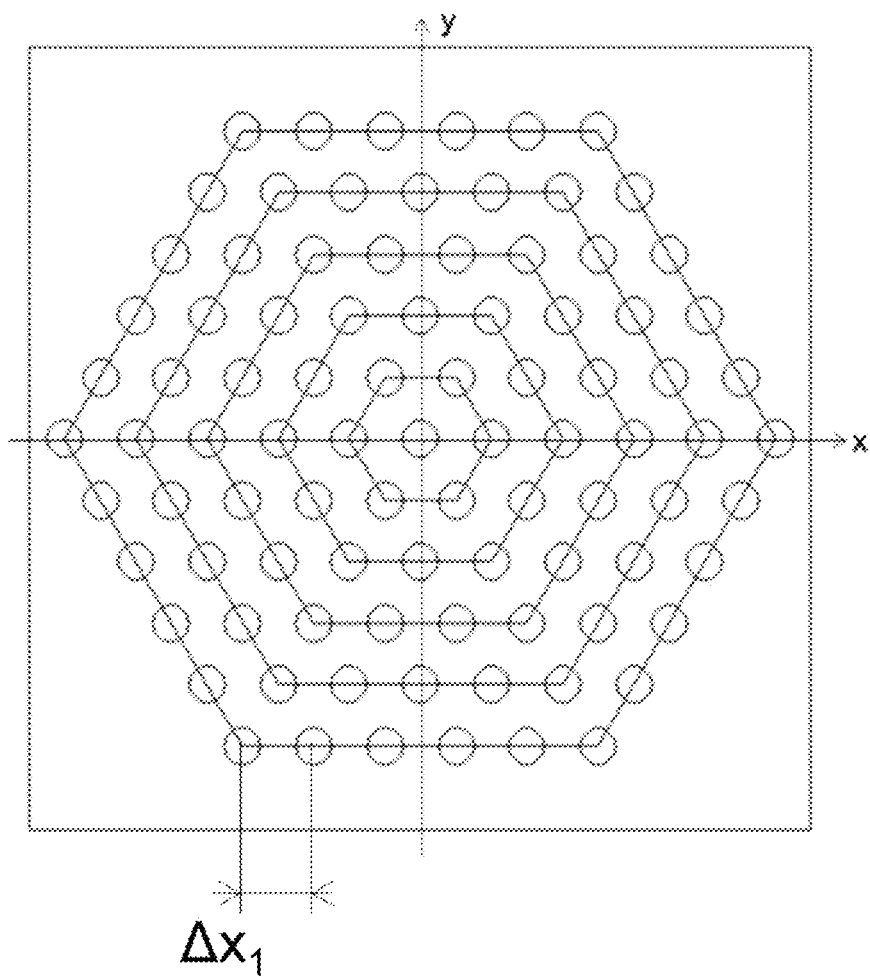
FIG. 4 is a plan view illustrating another example of the arrangement of the holes in the multi-light-source forming unit.

Note that, in an example illustrated in FIG. 3, in the multi-light-source forming unit 13, a plurality of holes for causing multi-beams to pass is arranged in a square lattice shape (a matrix shape). However, the arrangement of the plurality of holes is not limited to the square lattice shape (the matrix shape) as long as the plurality of holes is arranged at equal intervals (equal pitches) one another. For example, the plurality of holes may be arranged in a triangular lattice shape as illustrated in FIG. 4.

A detailed internal configuration of the multi-light-source forming unit 13 is explained below.

The reduction projection optical system is disposed further on the beam downstream side than the multi-light-source forming unit 13. The reduction projection optical system reduces and projects, on the surface of the sample 30 on the stage, the multi-light sources formed by the multi-light-source forming unit 13. In the illustrated example, the reduction projection optical system has the transfer lens 14 and the objective lens 17.

The scan deflector 15 is disposed between the transfer lens 14 and the objective lens 17. The scan deflector 15 deflects a traveling direction of multi-beams in an XY direction to cause the multi-beams to scan on the sample 30 surface.

Figure 9:
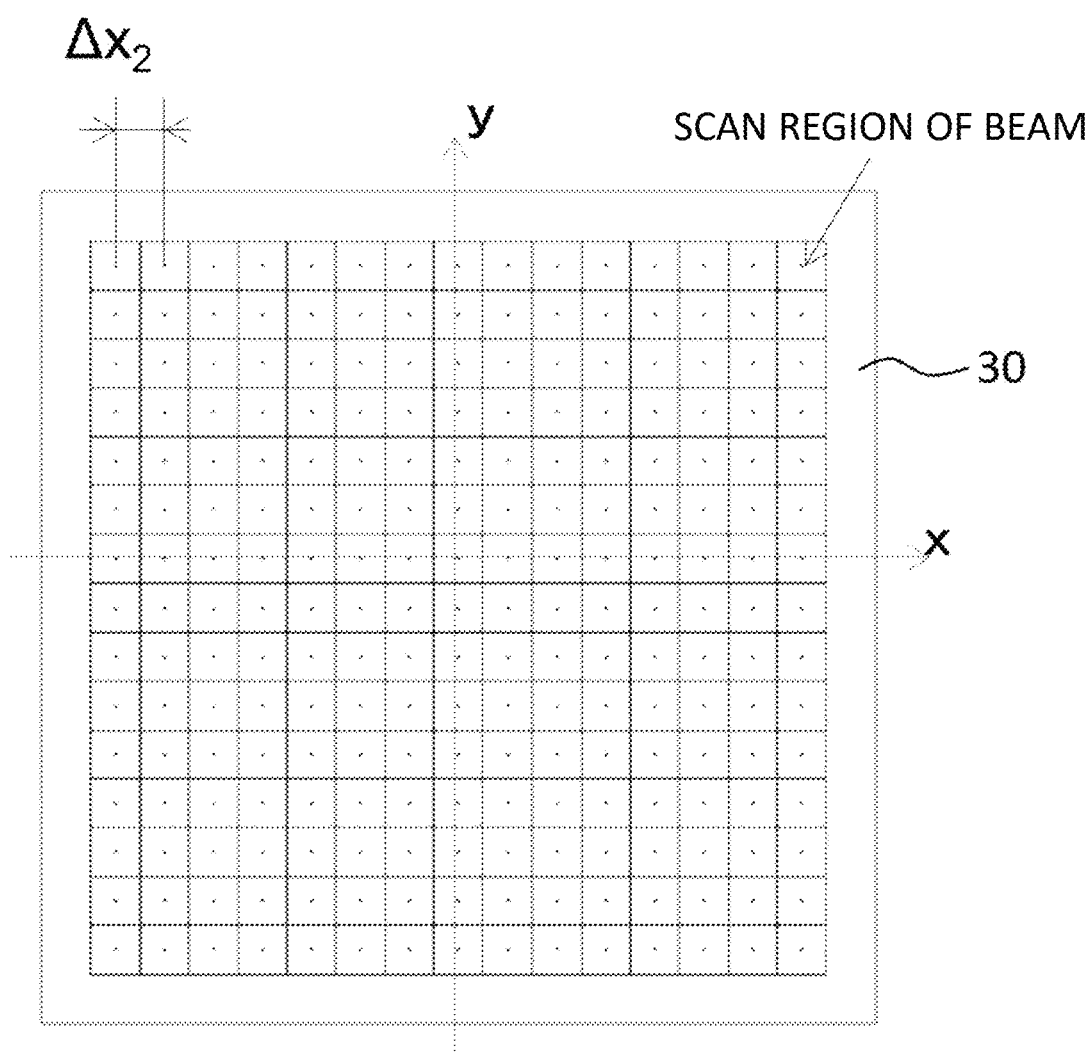
FIG. 9 is a plan view illustrating a scan region on a sample surface of multi-beams that have passed through the holes arranged as illustrated in FIG. 3.
Figure 10:
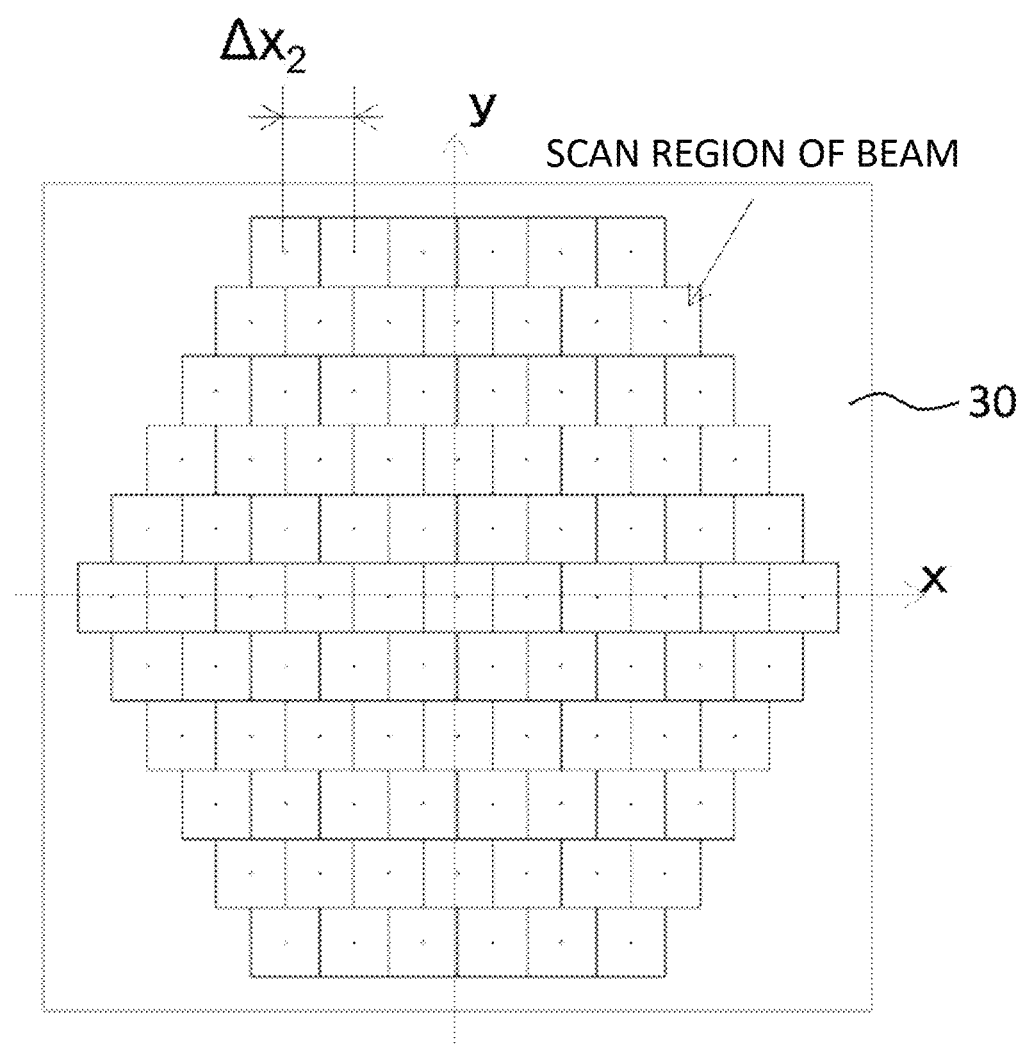
FIG. 10 is a plan view illustrating a scan region on the sample surface of multi-beams that have passed through the holes arranged as illustrated in FIG. 4.

FIG. 9 is a plan view illustrating a scan region on the sample 30 surface of multi-beams that have passed through the holes arranged in the square lattice shape (the matrix shape) illustrated in FIG. 3. Similarly, FIG. 10 is a plan view illustrating a scan region on the sample 30 surface of multi-beams that have passed through the holes arranged in the triangular lattice shape illustrated in FIG. 4. Referring to FIGS. 3 and 4 and FIGS. 9 and 10, when magnification M of the reduction optical system including the transfer lens 14 and the objective lens 17 is used, there is a relation of $\Delta X2 = M \times \Delta X1$ between a center interval $\Delta X1$ of two holes adjacent to each other in the multi-light-source forming unit 13 and a center interval $\Delta X2$ of two scan regions adjacent to each other on the sample 30 surface.

The beam separator 16 is an E×B filter. The beam separator 16 is disposed between the scan deflector 15 and the objective lens 17. The beam separator 16 causes the multi-beams, which have passed through the scan deflector 15, to pass to be made substantially perpendicularly incident on the sample 30 and deflects a signal electron (a secondary electron, a reflection electron, or the like) emitted from the sample 30 to an angle different from angles of optical axes of the incident multi-beams and guides the signal electron to the secondary optical system 10b.

As illustrated in FIG. 1, the secondary optical system 10b has a projection lens 18 and a detector 19.

The projection lens 18 projects, onto the detector 19, the signal electron that has been emitted from the sample 30 and passed through the objective lens 17 and the beam separator 16 (in the opposite direction of the incident multi-beams).

The detector 19 is a camera that detects the signal electron guided by the projection lens 18. The detector 19 has a plurality of pixels on the surface thereof. Various two-dimensional sensors can be applied to the detector 19. For example, a CCD (Charge Coupled Device) and a TDI (Time Delay Integration)—CCD may be applied to the detector 19. These sensors are sensors that perform signal detection after converting an electron into light. After the electron is converted into light using photoelectric conversion or a scintillator, image information of the light is transmitted to a TDI, which detects the light, and is detected. An image signal from the detector 19 is sent to a not-illustrated image processing device. Defect detection or defect determination for the surface of the sample 30 is performed by image processing.

<Configuration of the Multi-Light-Source Forming Unit>

A detailed internal configuration of the multi-light-source forming unit is explained. FIG. 2 is a schematic diagram illustrating an example of a configuration of the multi-light-source forming unit 13.

As illustrated in FIG. 2, the multi-light-source forming unit 13 has a porous aperture 21 and a plurality of (in the illustrated example, three) porous electrodes 22a to 22c disposed side by side in an optical axis direction. A plurality of holes for causing multi-beams to pass is formed in each of the porous aperture 21 and the porous electrodes 22a to 22c. In the following explanation, the plurality of porous electrodes 22a to 22c is sometimes referred to as first to third porous electrodes in order from the charged particle source 11 side (a beam upstream side). Portions where at least the plurality of holes is formed in the porous electrodes 22a to 22c respectively have flat shapes. Note that, in the illustrated example, the number of the porous electrodes 22a to 22c is three. However, the number of the porous electrodes 22a to 22c is not limited to this and may be four or more.

In the illustrated example, the porous aperture 21 is disposed further on the charged particle source 11 side (the beam upstream side) than the first porous electrode 22a. The porous aperture 21 divides a charged particle beam collimated by the collimator lens 12 into a plurality of beams to form multi-beams. Each of the multi-beams passed through the holes of the porous aperture 21 to be separated is made incident on the holes of the first porous electrode 22a.

Figure 5:
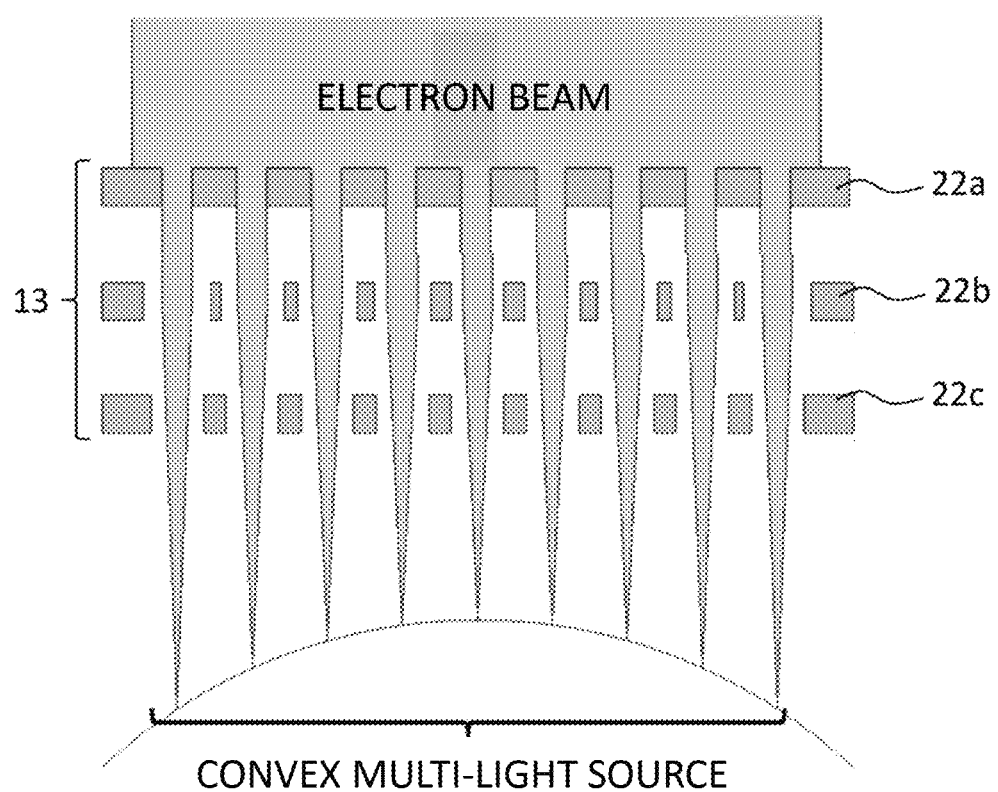
FIG. 5 is a schematic diagram illustrating a modification of the configuration of the multi-light-source forming unit.
Figure 6:
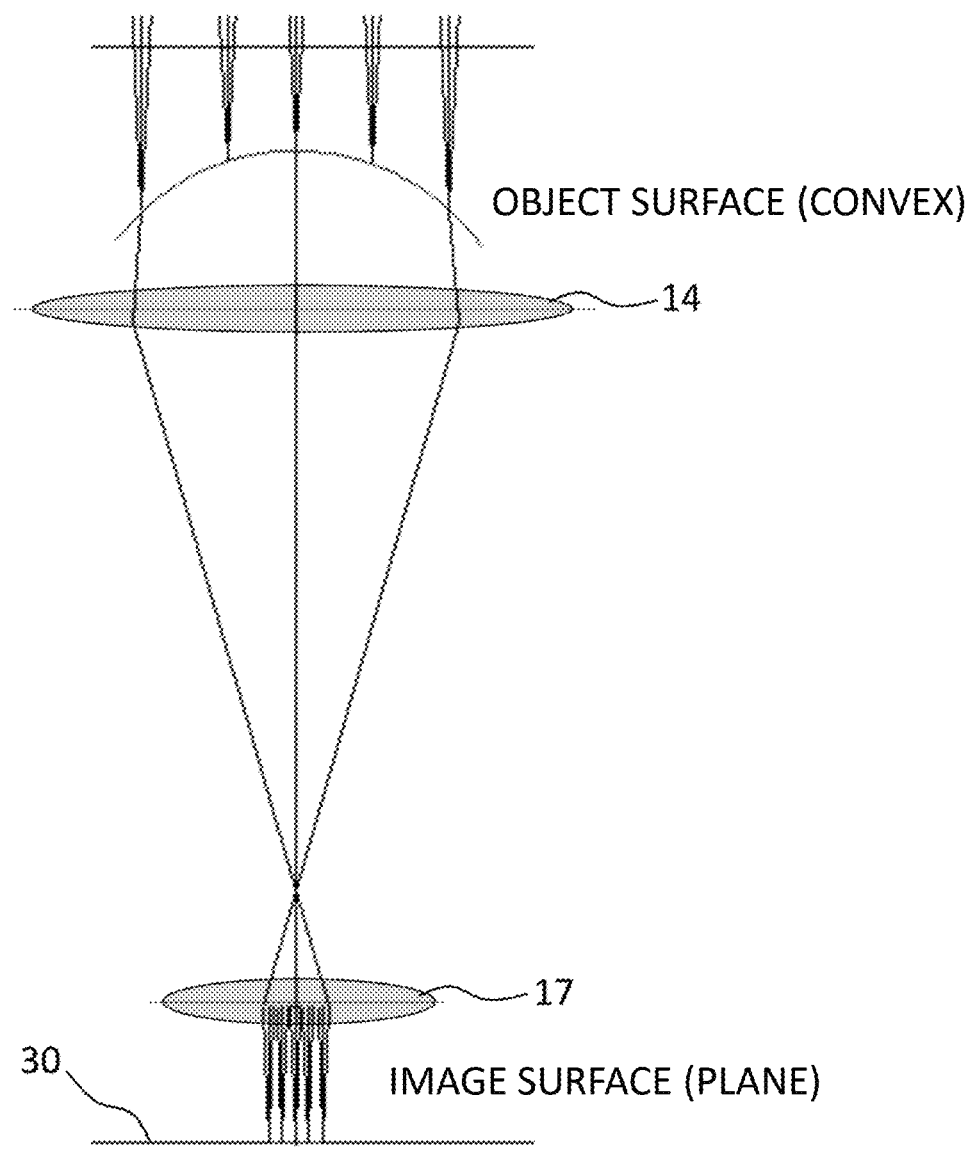
FIG. 6 is a diagram for explaining shapes of multi-light sources and an image surface.

As a modification, as illustrated in FIG. 5, the porous aperture 21 may be omitted from the multi-light-source forming unit 13. The first porous electrode 22a disposed most on the charged particle source 11 side (the beam upstream side) among the plurality of porous electrodes 22a to 22c may divide the collimated charged particle beam into a plurality of beams to form multi-beams. In this case, each of the multi-beams passed through the holes of the first porous electrode 22a to be separated is made incident on the holes of the second porous electrode 22b. Since the porous aperture 21 can be omitted, structure is simple.

Figure 25A:
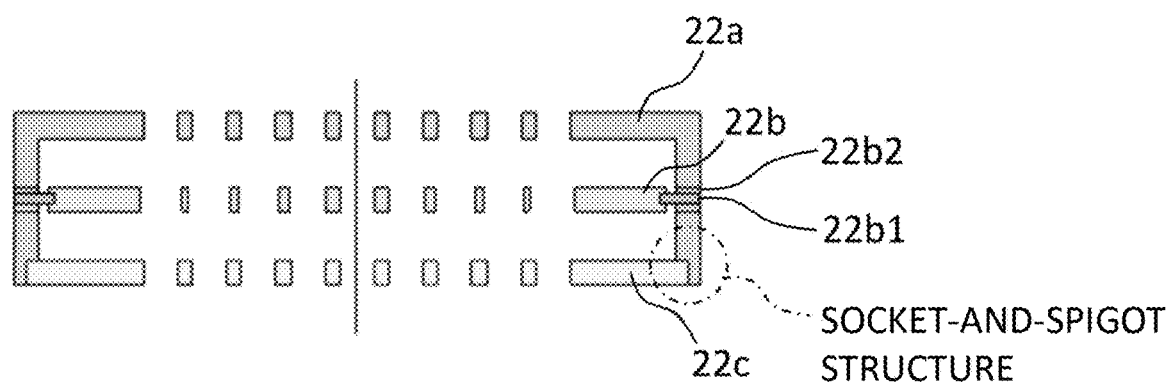
FIG. 25A is a longitudinal sectional view for explaining an example of an assembly structure of first to third porous electrodes.
Figure 25B:
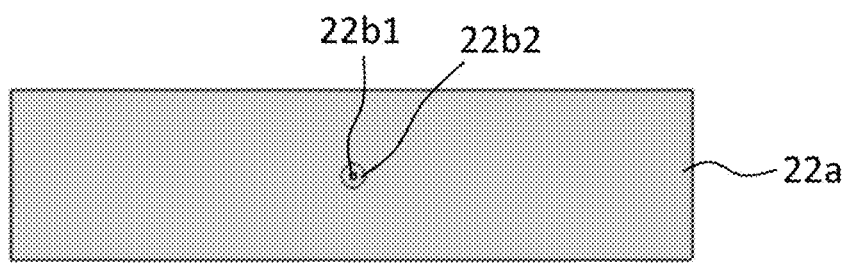
FIG. 25B is a side view of the assembly structure illustrated in FIG. 25A viewed from a lateral direction.
Figure 25C:
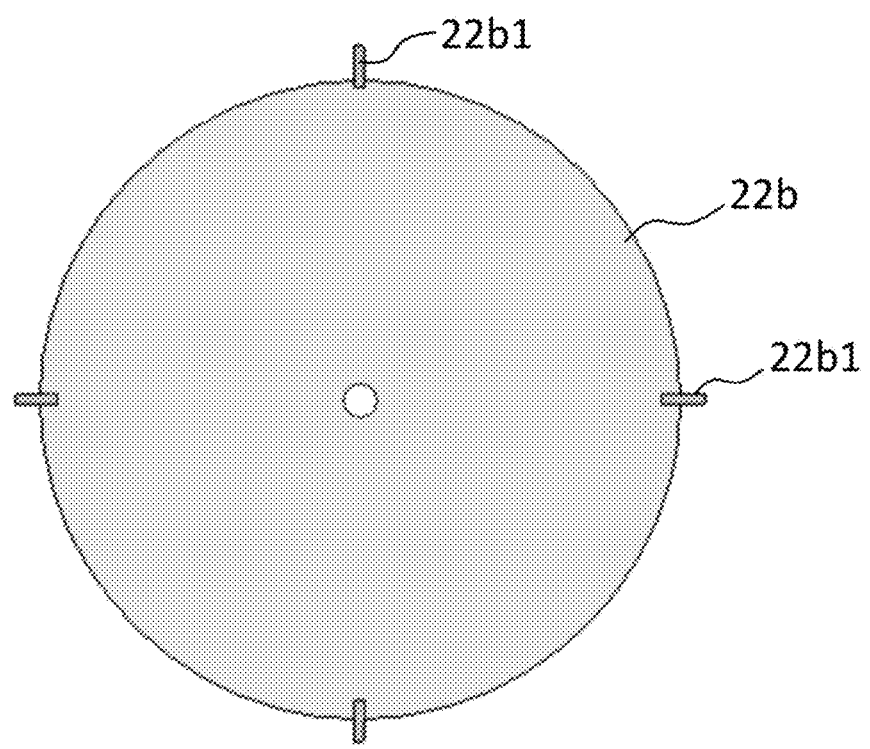
FIG. 25C is a plan view of the second porous electrode in the assembly structure illustrated in FIG. 25A.

FIG. 25A is a longitudinal sectional view for explaining an example of an assembly structure of the first to third porous electrodes 22a to 22c. FIG. 25B is a side view of the assembly structure illustrated in FIG. 25A viewed from a lateral direction; and FIG. 25C is a plan view of the second porous electrode in the assembly structure illustrated in FIG. 25A. Note that, in FIG. 25C, among the plurality of holes through which the multi-beams pass, only a hole in the center is representatively illustrated. Illustration of the other holes is omitted.

In the example illustrated in FIGS. 25A to 25C, the first porous electrode 22a has a disk part having a flat shape and a lateral wall part extending downward from an edge part of the disk part. The plurality of holes through which the multi-beams pass are formed in the disk part.

The second porous electrode 22b has a disk shape. A plurality of (in the illustrated example, four) voltage supply pins 22b1 projecting in the radial direction are provided at an edge part of the second porous electrode 22b. The voltage supply pins 22b1 of the second porous electrode 22b are inserted through, via insulators 22b2, through-holes formed in the lateral wall part of the first porous electrode 22a, whereby the first porous electrode 22a and the second porous electrode 22b are assembled in an easily aligned state.

The third porous electrode 22c has a disk shape. An edge part of the third porous electrode 22c is fit in a tip part of the lateral wall part of the first porous electrode 22a, whereby the first porous electrode 22a and the third porous electrode 22c are assembled in a socket-and-spigot structure. Consequently, it is easy to align the first porous electrode 22a and the third porous electrode 22c. Since the first porous electrode 22a and the third porous electrode 22c are assembled in the socket-and-spigot structure, the first porous electrode 22a and the third porous electrode 22c have the same potential. Consequently, the number of power supplies may be two.

Predetermined voltages are respectively applied to the first to third porous electrodes 22a to 22c. As an example, the first porous electrode 22a and the third porous electrode 22c have the same potential and potential (plus potential) higher than the potential of the first porous electrode 22a and the third porous electrode 22c is applied to the second porous electrode 22b. As a modification, the first porous electrode 22a and the third porous electrode 22c have the same potential and potential (minus potential) lower than the potential of the first porous electrode 22a and the third porous electrode 22c may be applied to the second porous electrode 22b. Electric fields having predetermined sizes and shapes are formed among the first to third porous electrodes 22a to 22c according to potential differences. Each of the multi-beams passing through the holes of the first to third porous electrodes 22a to 22c is condensed (focused) on imaginary one surface because of the influence of the electric fields formed among the porous electrodes 22a to 22c. A plurality of light sources (multi-light sources) located on the imaginary one surface are formed.

In this embodiment, as illustrated in FIGS. 2 and 5, the diameter of the holes on at least one porous electrode (in the illustrated example, the second porous electrode 22b) is formed to be larger further away from an optical axis (that is, a center line of the charged particle beam collimated by the collimator lens 12; hereinafter referred to as z axis as well) such that the surface on which the multi-light sources are located has a shape convex to the charged particle source 11 side (the beam upstream side).

More specifically, the diameter of the holes on at least one porous electrode (in the illustrated example, the second porous electrode 22b) is determined based on the following calculation.

Figure 11:
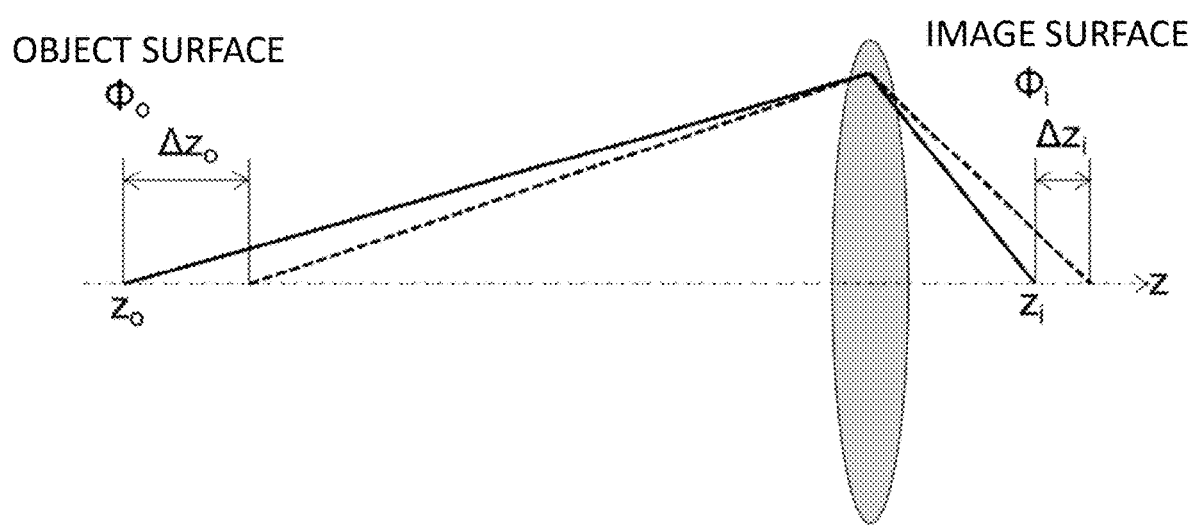
FIG. 11 is a diagram for explaining a positional relation between an object surface and an image surface in an optical system.

Referring to FIG. 11, in the lens optical system (that is, the reduction projection optical system), between a shift amount $\Delta z_o$ on the object surface and a shift amount $\Delta z_i$ on the image surface, there is a relation of the following Eq. 1:

$$\frac{\Delta z_i}{\Delta z_o} = M^2 \sqrt{\frac{\Phi_i}{\Phi_o}} \quad \text{(Eq.1)}$$

represented using magnitude M of the lens, on-axis potential $\Phi_o$ on the object surface, and on-axis potential $\Phi_i$ on the image surface.

Figure 12:
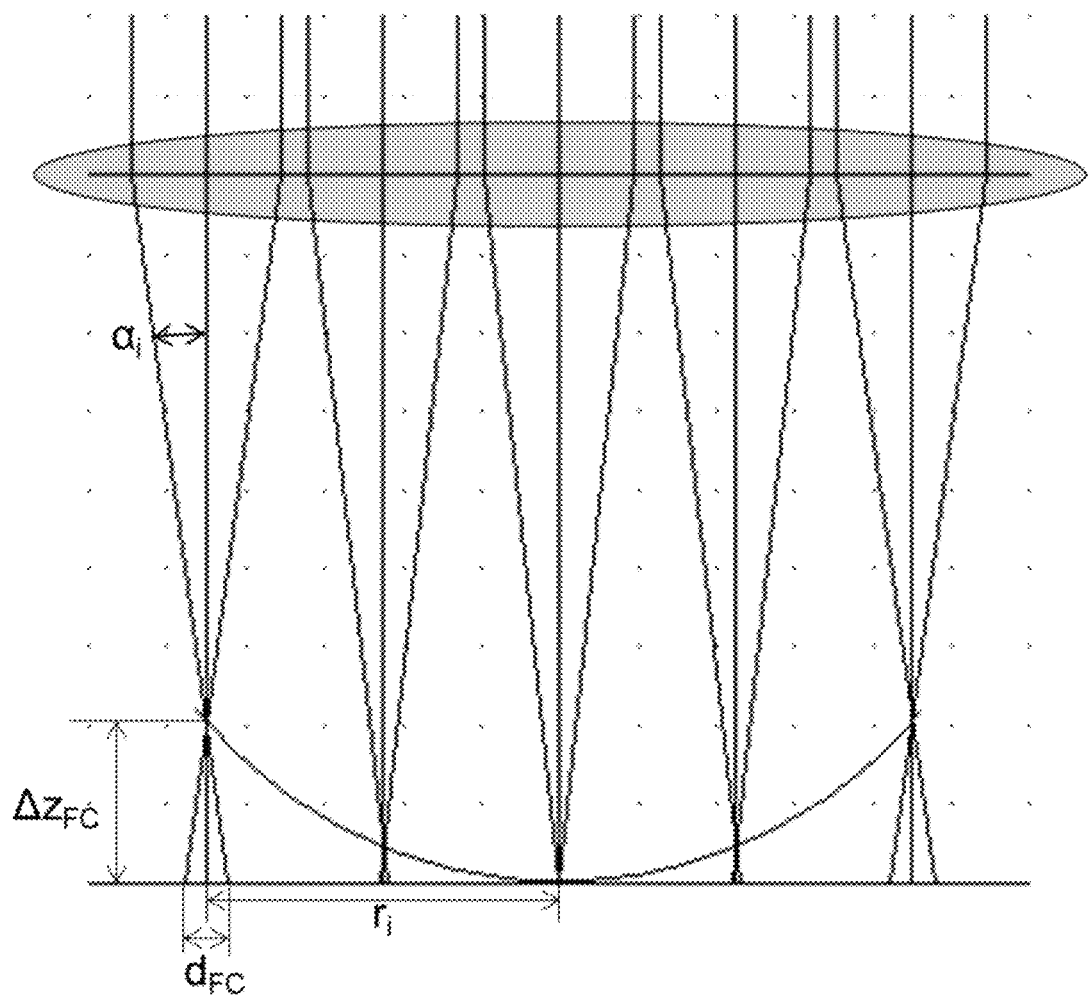
FIG. 12 is a diagram for explaining a shift amount of the image surface due to a field curvature.

Referring to FIG. 12, a field curvature aberration $d_{FC}$ can be represented by the following Eq. 2:

$$d_{FC} = 2A\alpha_i r_i^2 \quad \text{(Eq.2)}$$

using a field curvature aberration coefficient A, a field opening angle $\alpha_i$, and a distance $r_i$ from the center on the image surface. The field curvature aberration coefficient A can be calculated from a simulation or an experiment.

Similarly, a shift amount $\Delta z_{FC}$ on the image surface due to a field curvature can be represented by the following Eq. 3:

$$\Delta z_{FC} = Ar_i^2 \quad \text{(Eq.3)}$$

using the field curvature aberration coefficient A, the field opening angle $\alpha_i$, and the distance $r_i$ from the center on the image surface.

Figure 13:
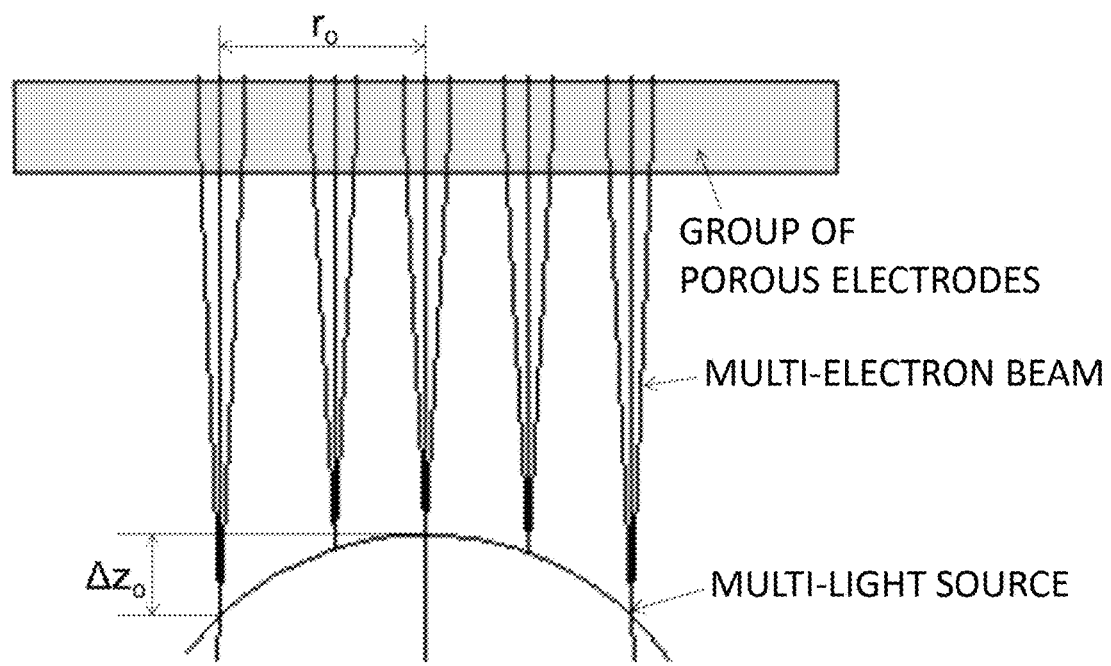
FIG. 13 is a diagram for explaining shift amounts of multi-light sources necessary for correcting the field curvature.

FIG. 13 is a diagram for explaining the shift amount $\Delta z_o$ of multi-light sources necessary for correcting the field curvature.

Referring to FIG. 13, the shift amount $\Delta z_o$ in the z-axis direction of the multi-light sources (light sources present at a distance $r_o$ from the optical axis) necessary for correcting the field curvature can be represented by the following Eq. 4:

$$\Delta z_o = Ar_o^2 \sqrt{\frac{\Phi_o}{\Phi_i}} \quad \text{(Eq.4)}$$

by putting $\Delta z_i = \Delta z_{FC}$ in the above Eqs. 1 to 3.

Figure 14:
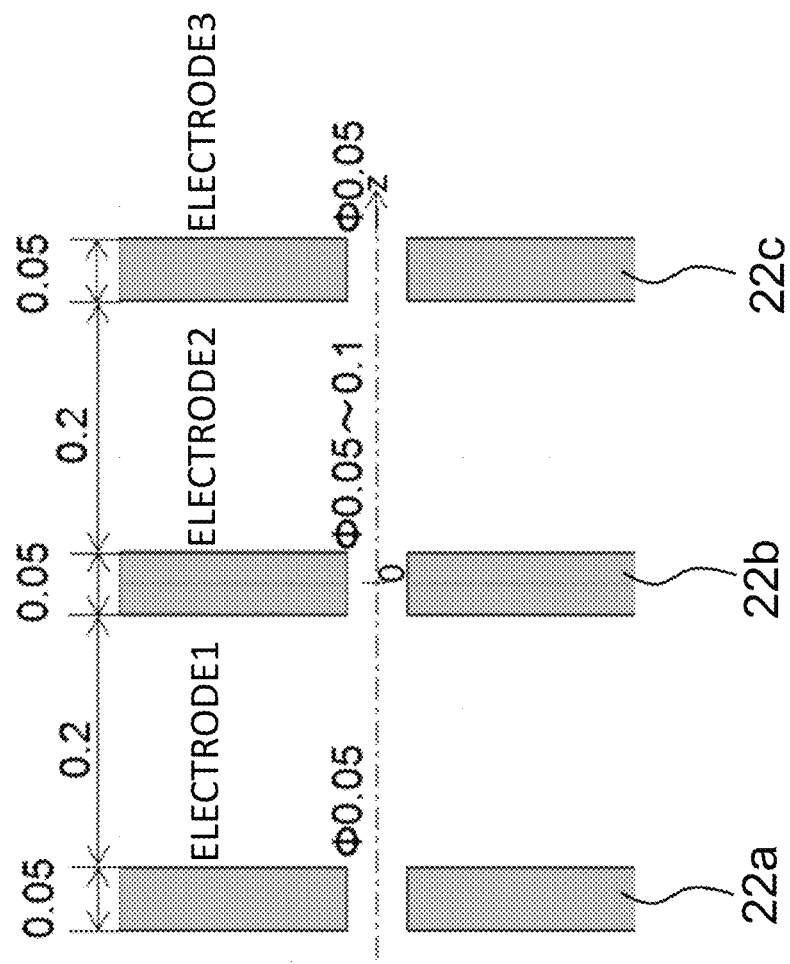
FIG. 14 is a diagram for explaining a calculation model for a group of porous electrodes.

On the other hand, by setting a predetermined calculation model and calculation conditions for a group of porous electrodes, the shift amount $\Delta z_o$ in the z-axis direction of focal positions (that is, the positions of the multi-light sources) can be calculated. Specifically, for example, as illustrated in FIG. 14, in a calculation model in which the thickness of the porous electrodes 22a to 22c is set to 0.05 mm and the interval among the porous electrodes 22a to 22c adjacent to one another is set to 0.2 mm, the shift amount $\Delta z_o$ of focal positions (that is, the positions of the multi-light sources) (based on a focal position of 00.05 mm) can be calculated under the following calculation conditions.

(Calculation Conditions)

Acceleration voltage: 3 kV

Applied voltages to the first porous electrode and the third porous electrode: 0 V (ground)

Applied voltage to the second porous electrode: −880.74 V

Inner diameters of the holes of the first porous electrode and the third porous electrode: 0.05 mm (fixed)

Inner diameter $\Phi$ of the holes of the second porous electrode: 0.05 to 0.1 mm (variable)

Figure 15:
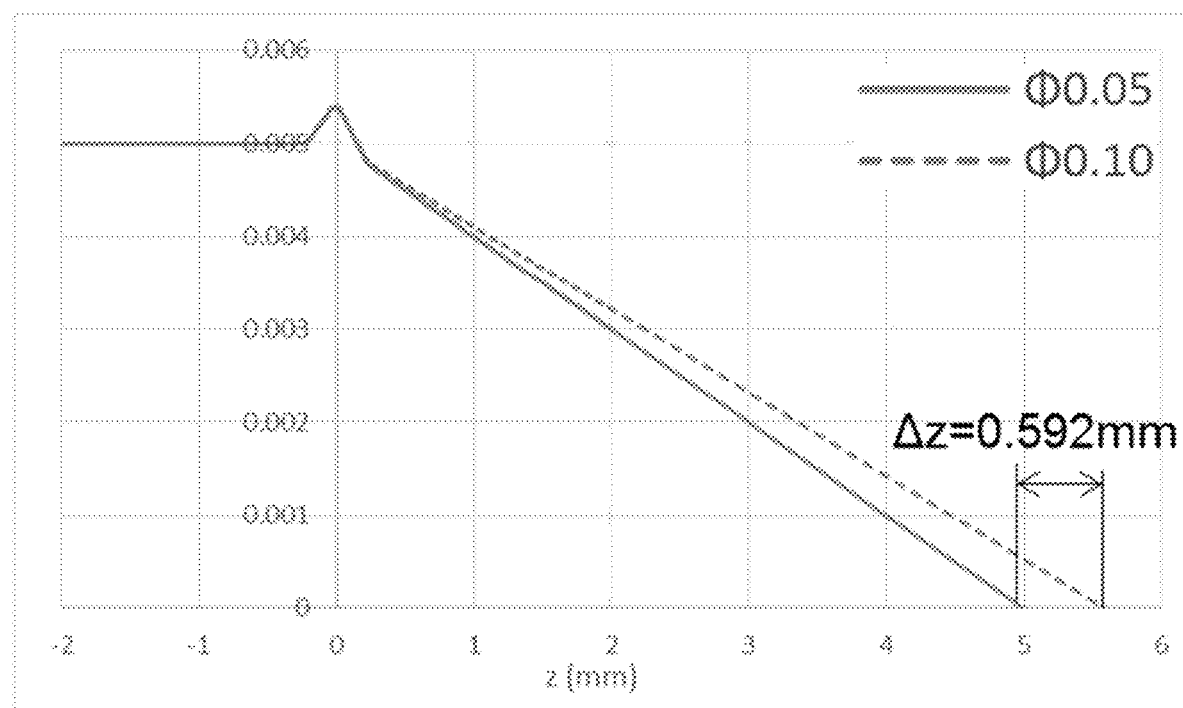
FIG. 15 is a graph illustrating focal positions of beams focused when the inner diameter of holes of a second porous electrode is 0.05 mm and when the inner diameter is 0.10 mm in the calculation model illustrated in FIG. 14.
Figure 16:
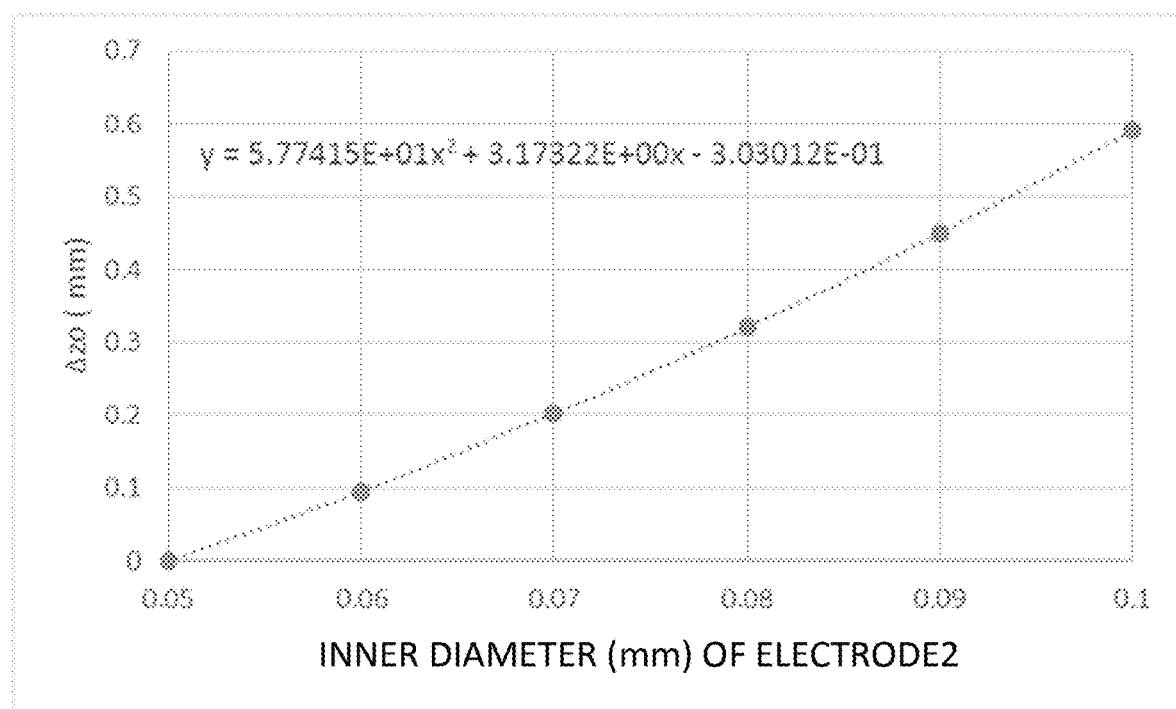
FIG. 16 is a graph illustrating a relation between the inner diameter of the holes of the second porous electrode and a shift amount of the focal position in the calculation model illustrated in FIG. 14.

FIG. 15 is a graph illustrating focal positions of beams (that is, the positions of the multi-light sources) focused when an inner diameter $\Phi$ of the holes of the second porous electrode 22b is 0.05 mm and when the inner diameter is 0.10 mm in the calculation model illustrated in FIG. 14 (the center of the second porous electrode 22b is set as the origin of the z axis). FIG. 16 is a graph illustrating a relation between the inner diameter $\Phi$ of the holes of the second porous electrode 22b and the shift amount $\Delta z_o$ of the focal positions (the positions of the multi-light sources) in the calculation model illustrated in FIG. 14.

As illustrated in the graph of FIG. 16, the relation between the inner diameter $\Phi$ of the holes of the second porous electrode and the shift amount $\Delta z_o$ of the focal positions (the positions of the multi-light sources) can be approximated by a quadratic function of the following Eq. 5:

$$\Delta z_o = a\Phi^2 + b\Phi + c \quad \text{(Eq.5)}.$$

Coefficients a, b, and c of the approximation function can be calculated by a simulation.

The relation between the inner diameter $\Phi$ of the holes of the second porous electrode and the shift amount $\Delta z_o$ of the focal positions (the positions of the multi-light sources) may be approximated by an n-th order function (n is a natural number equal to or larger than 3) of the following Eq. 6:

$$\Delta z_o = a_n\Phi^n + a_{n-1}\Phi^{n-1} \ldots + a_1\Phi + a \quad \text{(Eq.6)}$$

instead of being approximated by the quadratic function of the above Eq. 5.

Coefficients $a_n$, $a_{n-1}$, ..., $a_1$ and a of the approximation function can be calculated by a simulation.

Therefore, according to the above Eqs. 4 and 5, the inner diameter Φ of the holes of the second porous electrode 22b present at the distance $r_o$ from the center of the second porous electrode 22b (that is, the optical axis) is determined to satisfy the following Eq. 7:

$$A r_o^2 \sqrt{\frac{\Phi_o}{\Phi_i}} = a\Phi^2 + b\Phi + c. \quad \text{(Eq.7)}$$

Consequently, it is possible to correct the field curvature.

Alternatively, according to the above Eqs. 4 and 6, the inner diameter Φ of the holes of the second porous electrode 22b present at the distance $r_o$ from the center of the second porous electrode 22b (that is, the optical axis) is determined to satisfy the following Eq. 8:

$$A r_o^2 \sqrt{\frac{\Phi_o}{\Phi_i}} = a_n \Phi^n + a_{n-1} \Phi^{n-1} \ldots + a_1 \Phi + a. \quad \text{(Eq.8)}$$

Consequently, it is also possible to correct the field curvature.

Figure 23:
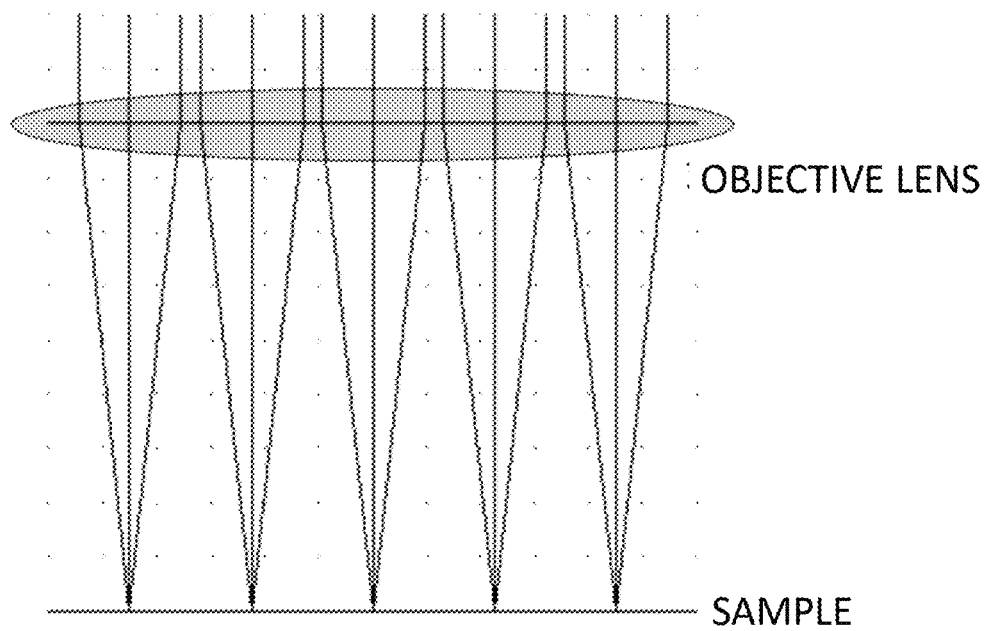
FIG. 23 is a schematic diagram illustrating an ideal optical system not having a field curvature.
Figure 24:
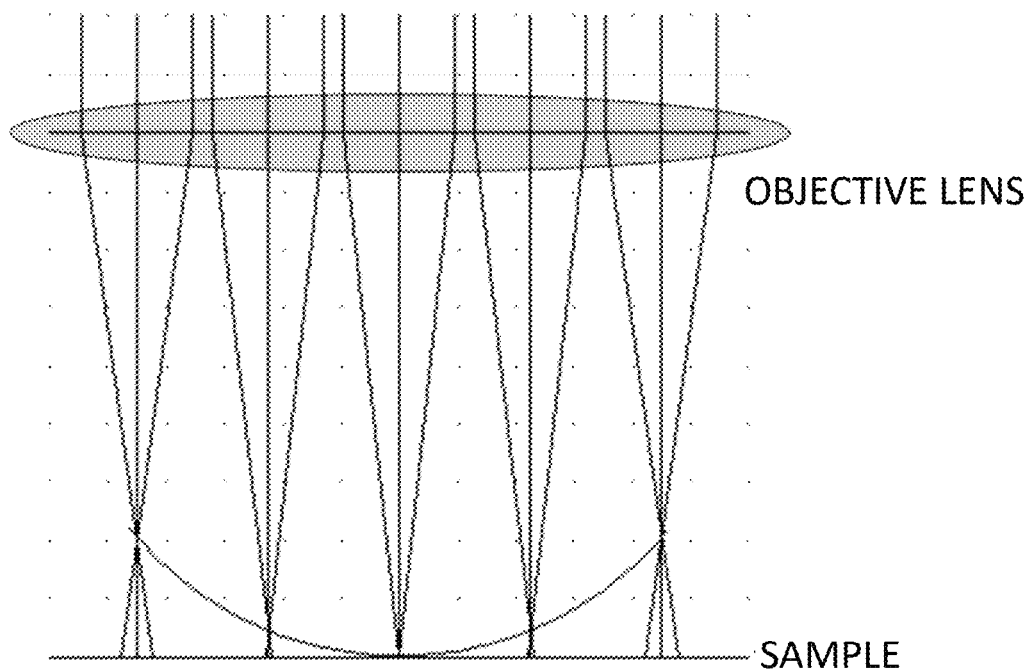
FIG. 24 is a schematic diagram illustrating an actual optical system having a field curvature.

Incidentally, as explained above, in the ideal optical system, as illustrated in FIG. 23, an image surface of a plane object surface (multi-light sources) is a plane. However, in the actual optical system, as illustrated in FIG. 24, an image surface of a plane object surface (multi-light sources) is a curved surface concave to a lens side because of the influence of a field curvature. That is, a focal position of a beam further deviates to the lens side further away from an optical axis. Therefore, a blur of an image on a sample surface is larger further away from the optical axis.

Figure 7:
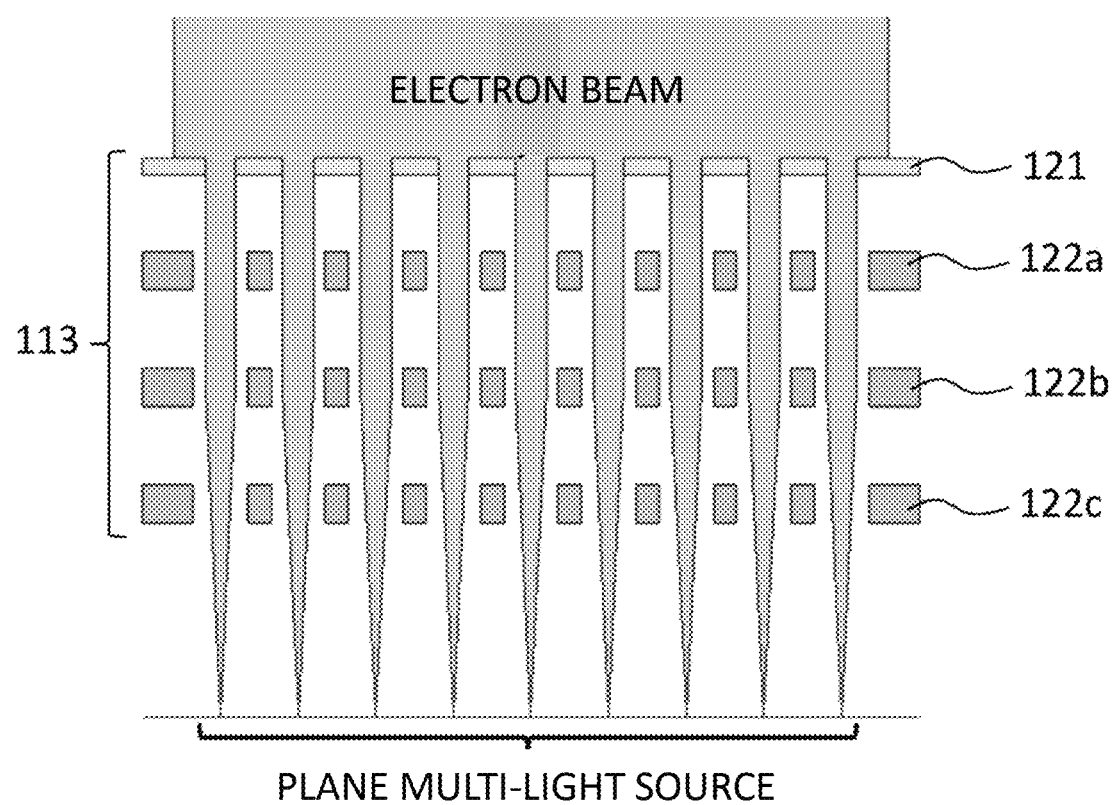
FIG. 7 is a schematic diagram illustrating a configuration of a multi-light-source forming unit according to a comparative example.

As a comparative example, as illustrated in FIG. 7, when the diameters of the plurality of holes for causing multi-beams to pass are set the same in each of the first to third porous electrodes 22a to 22c, electric fields having the same size and the same shape are formed among the porous electrodes 22a to 22c irrespective of a distance from the optical axis. Therefore, each of the multi-beams passing through the holes is affected by the electric fields having the same size and the same shape one another irrespective of the distance from the optical axis. As a result, each of the multi-beams is condensed (focused) on imaginary one plane. Multi-light sources located on the imaginary one plane are formed.

Figure 8:
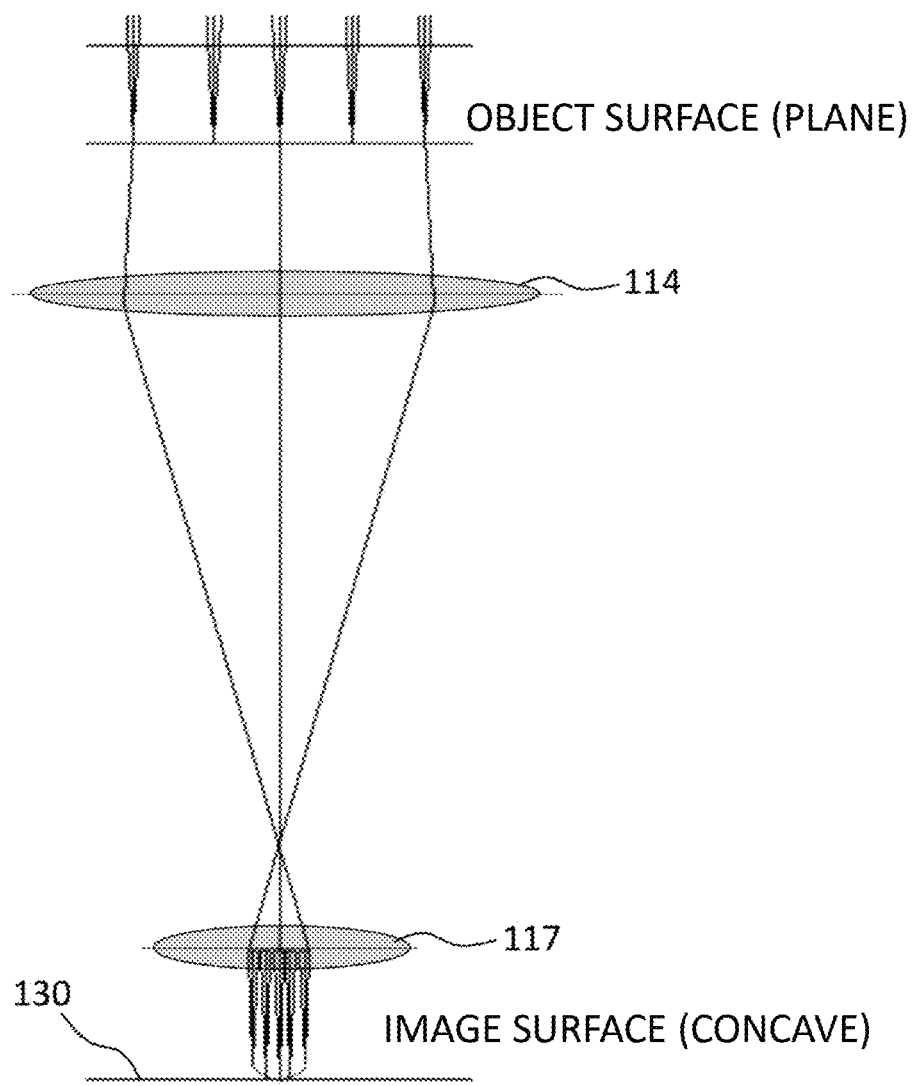
FIG. 8 is a diagram for explaining shapes of multi-light sources and an image surface in the comparative example.

In this case, as illustrated in FIG. 8, an image surface is formed as a curved surface concave to the lens (reduction optical system) side because of the influence of a field curvature in the reduction optical system including the transfer lens 14 and the objective lens 17. That is, a focal position of a beam further deviates to the lens (reduction optical system) side further away from the optical axis. Therefore, a blur of an image on the sample surface is larger further away from the optical axis.

On the other hand, according to this embodiment, as illustrated in FIGS. 2 and 5, the diameter of the holes on the second porous electrode 22b is formed larger further away from the optical axis. Therefore, power of the lens is smaller further away from the optical axis. Focusing power of the multi-beams decreases further away from the optical axis.

Therefore, each of the multi-beams passing through the holes is condensed (focused) on an imaginary curved surface convex to the charged particle source 11 side (the beam upstream side). That is, multi-light sources located on the imaginary curved surface convex to the charged particle source 11 side (the beam upstream side) are formed.

When the surface (an object surface) on which the multi-light sources are located is formed in a shape convex to the charged particle source 11 side (the beam upstream side), the position of a light source is closer to the reduction optical system (lens) side further away from the optical axis. However, as illustrated in FIG. 11, as the position of the light source (the object surface) is closer to the lens side, the position of an image surface shifts further to the opposite side of the lens as the position of the light source (the object surface) is closer to the lens side (see a broken line in FIG. 11). Therefore, the influence of the field curvature that causes the focal position to further shift to the lens side further away from the optical axis can be offset and corrected. Consequently, even in a position away from the optical axis, a blur of an image on the sample surface can be reduced.

According to this embodiment, the portions where the plurality of holes is formed in the porous electrodes 22a to 22c respectively have flat shapes. Therefore, it is easy to manufacture the porous electrodes themselves compared with when the portions where the plurality of holes is formed in the porous electrodes are formed in curved surface shapes.

According to this embodiment, the first porous electrode 22a and the third porous electrode 22c are assembled in the socket-and-spigot structure. Therefore, it is easy to align the first porous electrode 22a and the third porous electrode 22c.

<Example>

A specific example according to this embodiment is explained.

Figure 17:
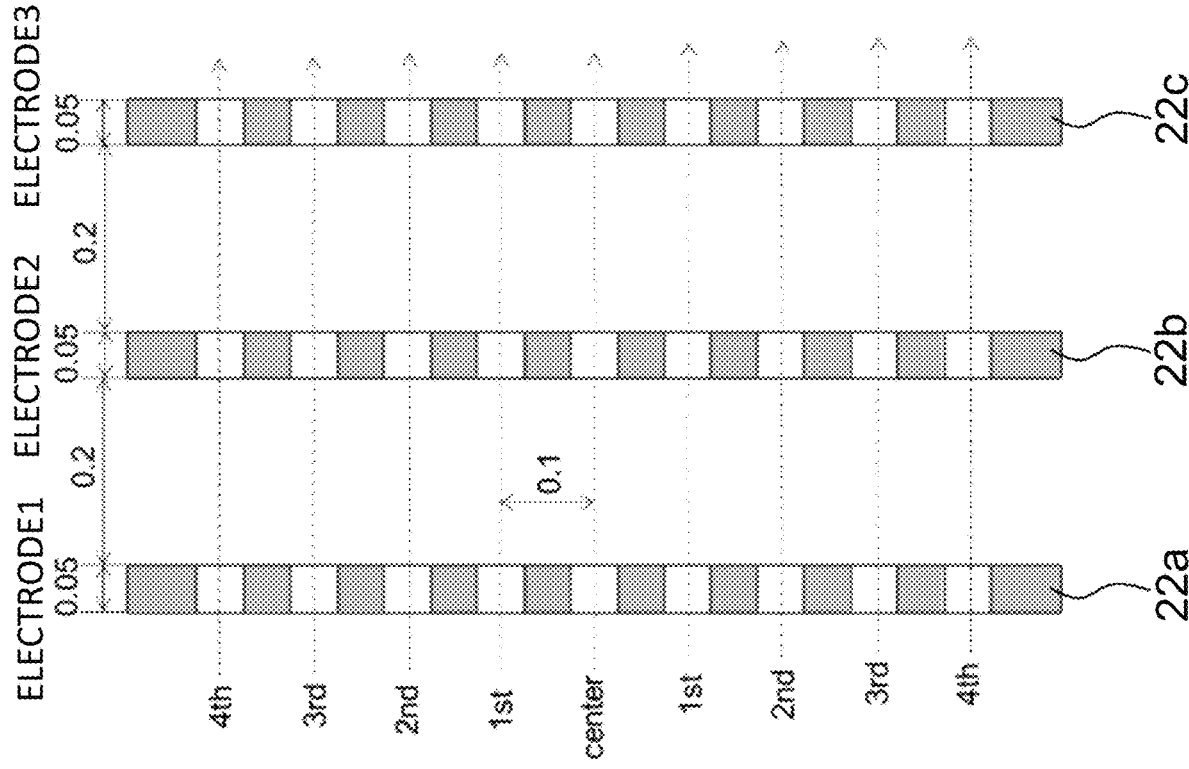
FIG. 17 is a diagram illustrating calculation conditions for the inner diameter of the holes of the second porous electrode.
Figure 18:
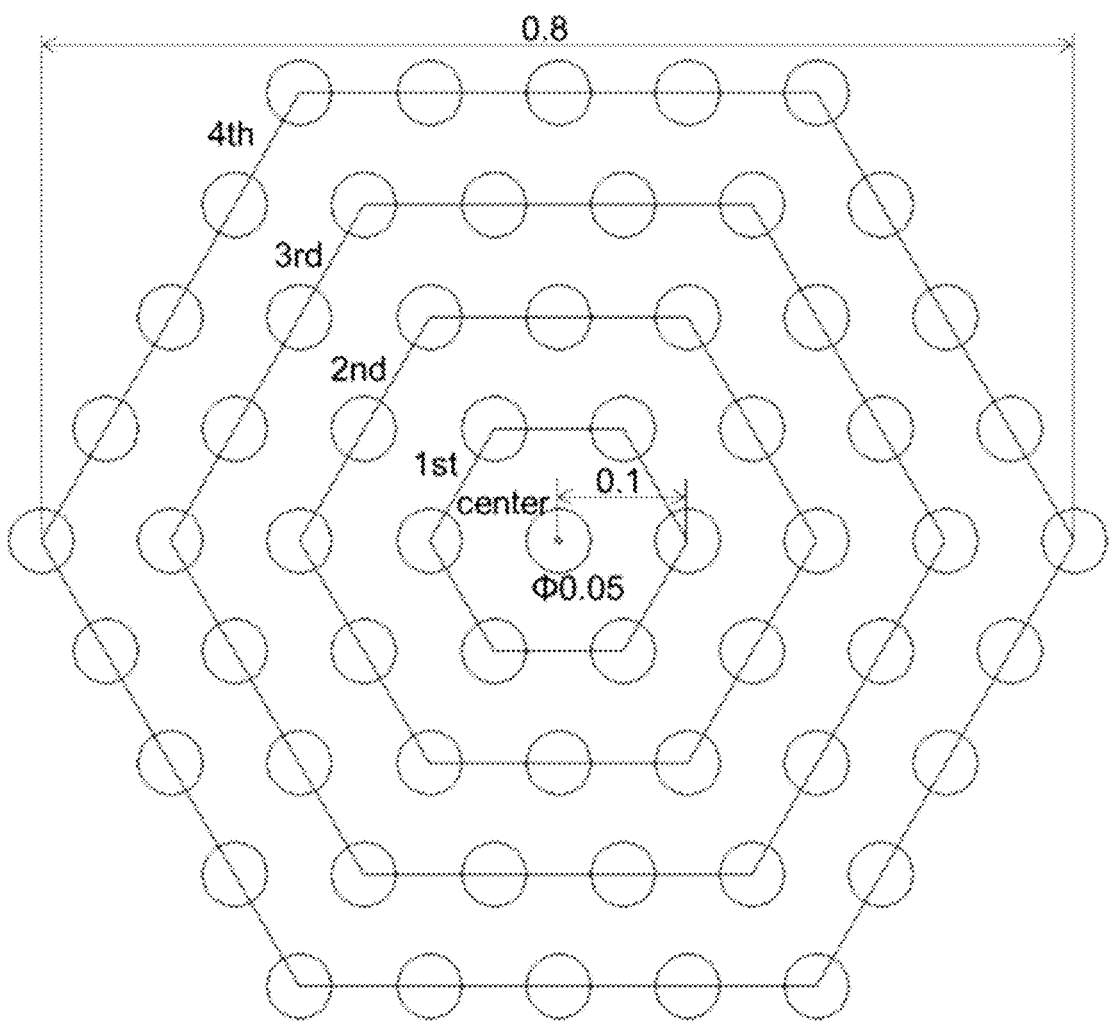
FIG. 18 is a diagram illustrating calculation conditions for the inner diameter of the holes of the second porous electrode.

Referring to FIGS. 17 and 18, the shift amount $\Delta z_o$ of the focal positions (the positions of the multi-light sources) was calculated under the calculation conditions described above in a calculation model in which the arrangement of the holes: a triangular lattice 0.1 mm pitch (common to the first to third porous electrodes 22a to 22c)

the number of holes on the porous electrodes 22a to 22c: 61 the diameters of the holes of the first porous electrode 22a and the third porous electrode 22c: all of the diameters are 0.05 mm the diameters of the holes of the second porous electrode 22b: only the hole in the center is Φ0.05 mm.

As illustrated in FIG. 16, a graph illustrating a relation between the inner diameter Φ of the holes of the second porous electrode 22b and the shift amount $\Delta z_o$ of the focal positions (the positions of the multi-light sources) was created. In the graph illustrating the relation between the inner diameter Φ of the holes of the second porous electrode 22b and the shift amount $\Delta z_o$ of the focal positions (the positions of the multi-light sources), when the relation was approximated using the quadratic function indicated by the above Eq. 5, the coefficients a, b, and c of the approximation function were calculated as follows.

a=5.77415e+1
b=3.17322
c=−3.03012e−1

Therefore, the inner diameter Φ of the holes of the second porous electrode 22b that can correct the field curvature was successfully calculated using the above Eq. 6. FIG. 19 is a table illustrating a calculation result at the time when the inner diameter $\Phi$ of the holes of the second porous electrode 22b that can correct the field curvature was calculated under the following calculation conditions.

(Calculation Conditions)

Object surface potential: $\Phi_o$=3 kV
Image surface potential: $\Phi_i$=3 kV
Magnitude of the reduction optical system: M=0.1
Field curvature aberration coefficient: A=500

By forming the inner diameter $\Phi$ of the holes of the second porous electrode 22b larger further away from the optical axis according to the table illustrated in FIG. 19, it is possible to correct the field curvature.

<Modification>

Note that, in the embodiment explained above, as illustrated in the table of FIG. 19, the diameters of the holes of at least one porous electrode (for example, the second porous electrode 22b) are different according to the distances from the optical axis. However, the present technique is not limited to this.

That is, at least one porous electrode (for example, the second porous electrode 22b) may be divided into a plurality of regions according to the distances from the optical axis. Each of the regions may include at least two holes having different distances from the optical axis. The diameters of the holes may be set the same for each of the regions. The diameters of the holes may be larger in the region further away from the optical axis.

Figure 20:
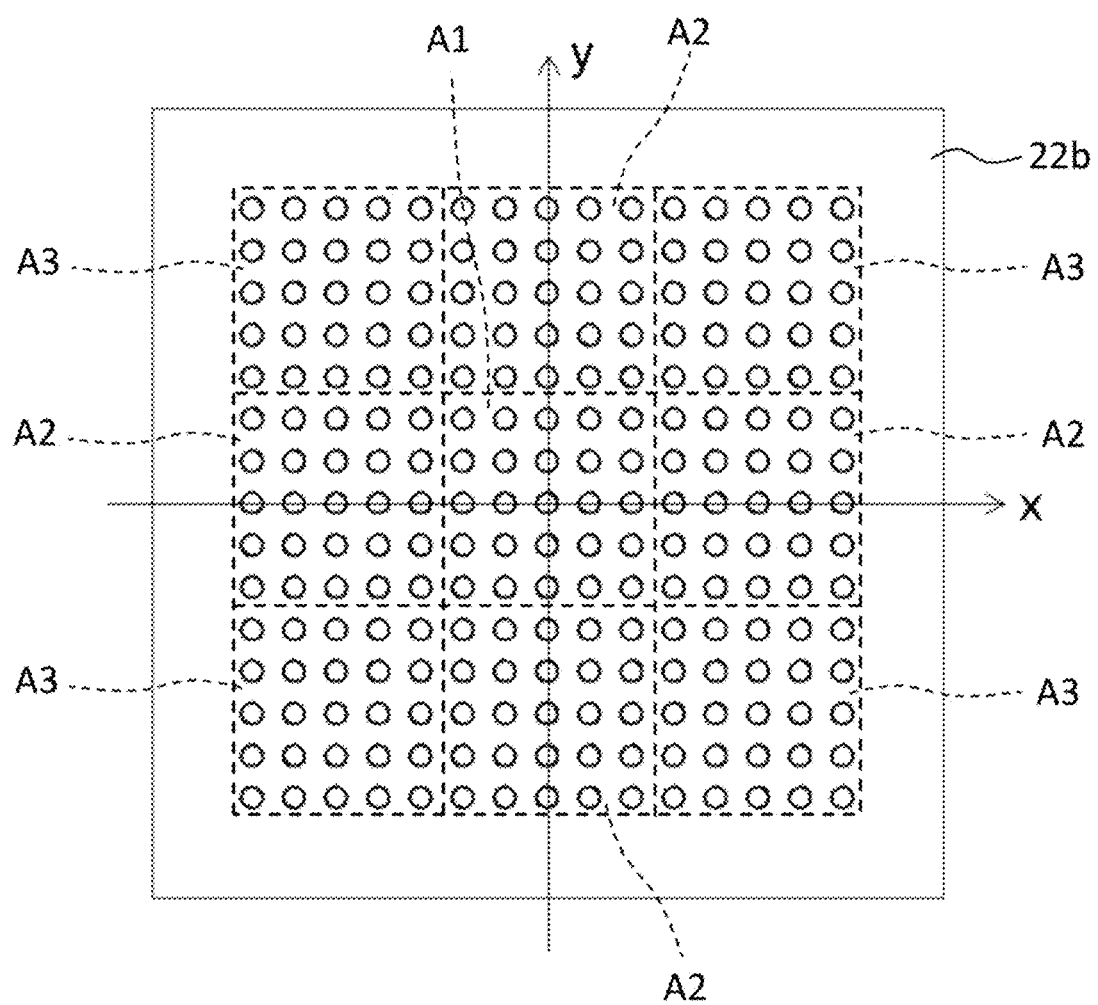
FIG. 20 is a plan view illustrating a first example of a porous electrode divided into a plurality of regions.

FIG. 20 is a plan view illustrating a first example of a porous electrode divided into a plurality of regions; In the example illustrated in FIG. 20, the second porous electrode 22b is divided into three regions A1 to A3 according to the distances from the center (the optical axis). Each of the regions A1 to A3 includes at least two holes having different distances from the optical axis. The diameters of the holes are set the same for each of the regions A1 to A3. Further, since the second region A2 is further away from the center (the optical axis) than the first region A1 the diameter of the holes in the second region A2 is larger than the diameter of the holes in the first region A1. Since the third region A3 is further away from the center (the optical axis) than the second region A2, the diameter of the holes in the third region A3 is larger than the diameter of the holes in the second region A2.

Figure 21:
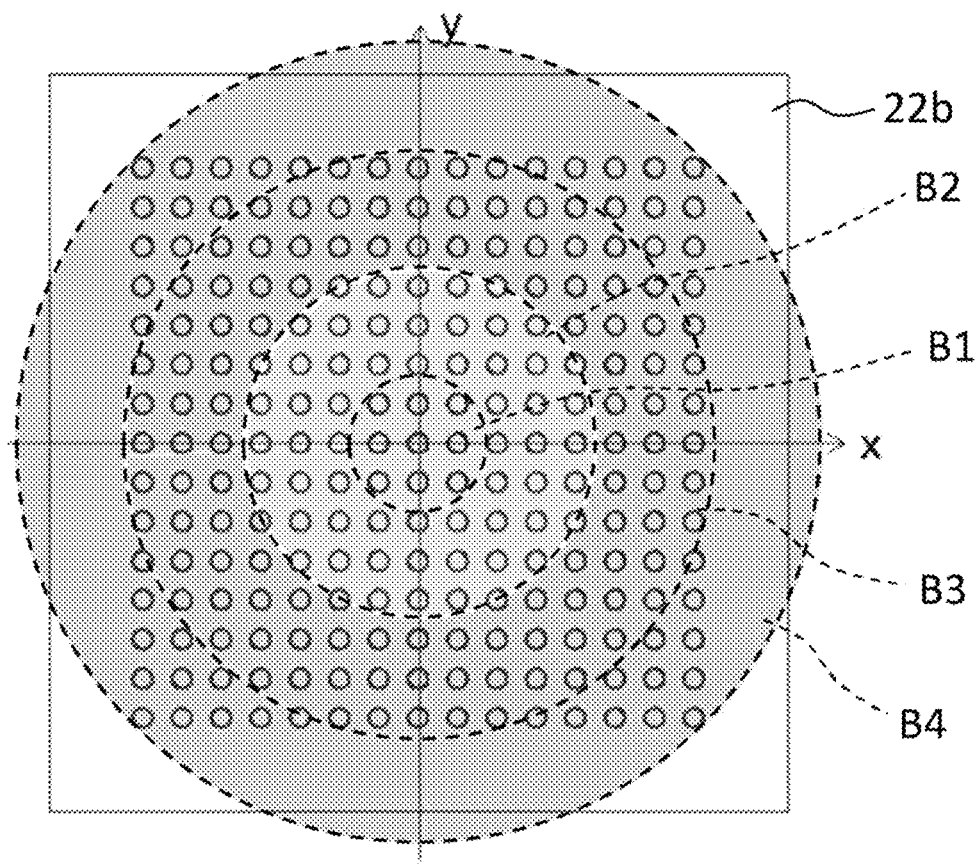
FIG. 21 is a plan view illustrating a second example of the porous electrode divided into the plurality of regions.

FIG. 21 is a plan view illustrating a second example of the porous electrode divided into the plurality of regions; In the example illustrated in FIG. 21, the second porous electrode 22b is divided into four regions B1 to B4 according to the distances from the center (the optical axis). Each of the regions B1 to B4 includes at least two holes having different distances from the optical axis. The diameters of the holes are set the same for each of the regions B1 to B4. Further, since the second region B2 is further away from the center (the optical axis) than the first region B1, the diameter of the holes in the second region B2 is larger than the diameter of the holes in the first region B1. Since the third region B3 is further away from the center (the optical axis) than the second region B2, the diameter of the holes in the third region B3 is larger than the diameter of the holes in the second region B2. Since the fourth region B4 is further away from the center (the optical axis) than the third region B3, the diameter of the holes in the fourth region B4 is larger than the diameter of the holes in the third region B3.

Figure 22:
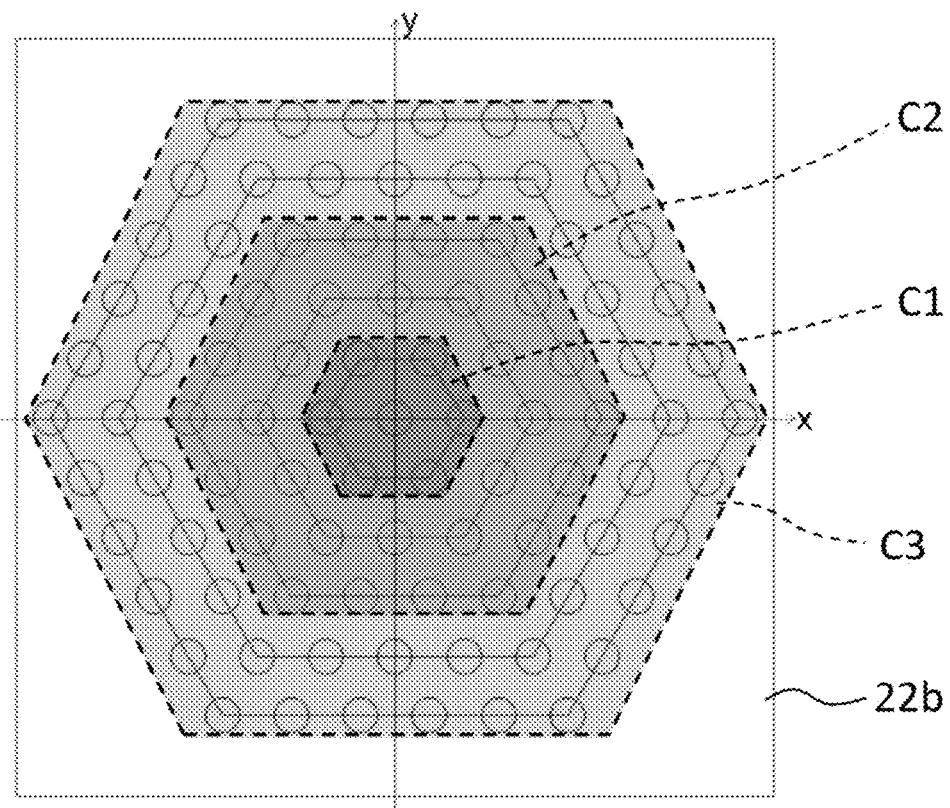
FIG. 22 is a plan view illustrating a third example of the porous electrode divided into the plurality of regions.

FIG. 22 is a plan view illustrating a third example of the porous electrode divided into the plurality of regions; In the example illustrated in FIG. 22, the second porous electrode 22b is divided into three regions C1 to C3 according to the distances from the center (the optical axis). Each of the regions C1 to C3 includes at least two holes having different distances from the optical axis. The diameters of the holes are set the same for each of the regions C1 to C3. Further, since the second region C2 is further away from the center (the optical axis) than the first region C1, the diameter of the holes in the second region C2 is larger than the diameter of the holes in the first region C1. Since the third region C3 is further away from the center (the optical axis) than the second region C2, the diameter of the holes in the third region C3 is larger than the diameter of the holes in the second region C2.

Note that, in the examples illustrated in FIGS. 20 to 22, the number of divisions of the regions can be changed as appropriate according to, for example, a necessary correction amount of the field curvature. For example, if the influence of the field curvature is small, the number of divisions of the regions may be reduced. On the other hand, if the influence of the field curvature is large, the regions may be divided finer.

The embodiments of the present technique are explained above according to the illustrations. However, the scope of the present technique is not limited to these embodiments and can be changed or modified according to an object within the scope described in the claims. The embodiments can be combined as appropriate in a range in which processing contents do not contradict.

What is claimed is:

1. A method of determining the diameter of the holes of the second porous electrode in the charged particle multi-beam device the charged particle multi-beam device comprising: a charged particle source that emits a charged particle beam; a collimator lens that collimates the charged particle beam emitted from the charged particle source; a multi-light-source forming unit that divides the collimated charged particle beam into a plurality of beams to form multi-beams and condenses the respective multi-beams on one surface to form multi-light sources; and a reduction projection optical system that reduces and projects the multi-light sources on a sample surface, wherein the multi-light-source forming unit has first to third porous electrodes disposed side by side in an optical axis direction in order from the charged particle source side, a plurality of holes for causing the multi-beams to pass is formed in each of the first to third porous electrodes, the first porous electrode and the third porous electrode have identical potential and the second porous electrode has potential different from the potential of the first porous electrode and the third porous electrode, and a diameter of the holes on the second porous electrode is formed larger further away from an optical axis such that a surface on which the multi-light sources are located is formed in a shape convex to the charged particle source side; the method comprising:

calculating a field curvature coefficient A of a reduction projection optical system with a simulation or an experiment;

calculating, with a simulation, a relation between an inner diameter $\Phi$ of the holes of the second porous electrode and a shift amount $\Delta z_o$ of a focal position by temporarily selecting variable values for the inner diameter $\Phi$ to calculate respective shift amounts $\Delta z_o$ via simulation to thereby obtain multiple pairs of ($\Phi$, $\Delta z_o$);

plotting the multiple pairs of ($\Phi$, $\Delta z_o$) on a graph to thereby determine coefficients a, b, and c by approximating them with the following Eq. 1:

$$\Delta z_o = a\Phi^2 + b\Phi + c \qquad \text{(Eq.1); and}$$

determining, using on-axis potential $\Phi_o$ on an object surface in the reduction projection optical system and on-axis potential $\Phi_i$ on an image surface, a diameter $\Phi$ of the holes of the second porous electrode at a distance $r_o$ from the optical axis to satisfy following Eq. 2:

$$Ar_o^2\sqrt{\frac{\Phi_o}{\Phi_i}} = a\Phi^2 + b\Phi + c; \text{ and} \tag{Eq.2}$$

forming the holes in the second porous electrode at the distance $r_o$ from the optical axis to include the diameter $\Phi$.

2. A method of determining the diameter of the holes of the second porous electrode in the charged particle multi-beam device the charged particle multi-beam device comprising: a charged particle source that emits a charged particle beam; a collimator lens that collimates the charged particle beam emitted from the charged particle source; a multi-light-source forming unit that divides the collimated charged particle beam into a plurality of beams to form multi-beams and condenses the respective multi-beams on one surface to form multi-light sources; and a reduction projection optical system that reduces and projects the multi-light sources on a sample surface, wherein the multi-light-source forming unit has first to third porous electrodes disposed side by side in an optical axis direction in order from the charged particle source side, a plurality of holes for causing the multi-beams to pass is formed in each of the first to third porous electrodes, the first porous electrode and the third porous electrode have identical potential and the second porous electrode has potential different from the potential of the first porous electrode and the third porous electrode, and a diameter of the holes on the second porous electrode is formed larger further away from an optical axis such that a surface on which the multi-light sources are located is formed in a shape convex to the charged particle source side; the method comprising:

calculating a field curvature coefficient A of a reduction projection optical system with a simulation or an experiment;

calculating, with a simulation, a relation between an inner diameter $\Phi$ of the holes of the second porous electrode and a shift amount $\Delta z_o$ of a focal position by temporarily selecting variable values for the inner diameter $\Phi$ to calculate respective shift amounts $\Delta z_o$ via simulation to thereby obtain multiple pairs of ($\Phi$, $\Delta z_o$);

plotting the multiple pairs of ($\Phi$, $\Delta z_o$) on a graph to thereby determine coefficients $a_n$, $a_{n-1}$, ..., $a_1$ by approximating them with the following Eq. 3:

$$\Delta z_o = a_n\Phi^n + a_{n-1}\Phi^{n-1} \ldots + a_1\Phi + a \tag{Eq.3}$$

wherein n is a natural number equal to or larger than 3 of an approximation function; and determining, using on-axis potential $\Phi_o$ on an object surface in the reduction projection optical system and on-axis potential $\Phi_i$ on an image surface, a diameter $\Phi$ of the holes of the second porous electrode at a distance $r_o$ from the optical axis to satisfy following Eq. 4:

$$Ar_o^2\sqrt{\frac{\Phi_o}{\Phi_i}} = a_n\Phi^n + a_{n-1}\Phi^{n-1} + \ldots + a_1\Phi + a \tag{Eq.4}$$

forming the holes in the second porous electrode at the distance $r_o$ from the optical axis to include the diameter $\Phi$.

* * * * *